US005200568A

United States Patent [19]

Fukushima et al.

[11] Patent Number: 5,200,568

[45] Date of Patent: Apr. 6, 1993

[54] METHOD OF CONTROLLING SOUND SOURCE FOR ELECTRONIC MUSICAL INSTRUMENT, AND ELECTRONIC MUSICAL INSTRUMENT ADOPTING THE METHOD

[76] Inventors: Yoshiko Fukushima; Satoshi Usa; Tetsuo Okamoto, all of 10-1, Nakazawa-cho, Hamamatsu-shi, Shizuoka-ken, Japan

[21] Appl. No.: 648,156

[22] Filed: Jan. 30, 1991

[30] Foreign Application Priority Data

Jan. 31, 1990 [JP] Japan .................................... 2-18896
Jan. 31, 1990 [JP] Japan .................................... 2-18897

[51] Int. Cl.[5] ......................... G10H 7/00; H03G 3/00

[52] U.S. Cl. ......................................... 84/658; 84/622; 84/626; 84/630

[58] Field of Search ......... 84/658, 660, 663, DIG. 10, 84/625, 627, 630, 633, 707, 741, 742, 615, 622, 626, 658, 659, DIG. 26; 331/78

[56] References Cited

U.S. PATENT DOCUMENTS

| | | | |
|---|---|---|---|
| 4,805,510 | 2/1989 | De Dianous . | |
| 4,984,276 | 1/1991 | Smith | 84/630 |
| 5,018,430 | 5/1991 | Iijima et al. | 84/625 |
| 5,024,133 | 6/1991 | Nakanishi et al. | 84/615 |
| 5,033,352 | 7/1991 | Kellogg et al. | 84/658 |

FOREIGN PATENT DOCUMENTS

| | | |
|---|---|---|
| 0248527 | 4/1987 | European Pat. Off. . |
| 63-40199 | 2/1963 | Japan . |
| 48-42963 | 12/1973 | Japan . |

*Primary Examiner*—William M. Shoop, Jr.
*Assistant Examiner*—Helen Kim

[57] ABSTRACT

In controlling a sound source for an electronic musical instrument, an operation data of a performance operation member corresponding to musical tone control parameters of a musical instrument is corrected according to a tone generation region characteristic of the musical instrument. The corrected data is inputted to a sound source circuit of the electronic musical instrument thereby a musical tone approximating of the musical instrument is regularly generated. The electronic musical instrument comprises a performance operation member for outputting position and pressure data of an operation member, a sound source for receiving musical tone control parameters corresponding to those of a musical instrument and generating a musical tone simulating that of the musical instrument, and a conversion circuit for converting the position and pressure data to those in a normal tone generation region as the musical tone control parameters in accordance with a tone generation region characteristic based on the musical tone control parameters of the musical instrument. The conversion circuit is connected to the sound source.

10 Claims, 32 Drawing Sheets

METHOD OF CONTROLLING SOUND SOURCE FOR ELECTRONIC MUSICAL INSTRUMENT, AND ELECTRONIC MUSICAL INSTRUMENT ADOPTING THE METHOD

BACKGROUND OF THE INVENTION

1. Field of the Invention

The present invention relates to a method of controlling a sound source for an electronic musical instrument and an electronic musical instrument which simulates an acoustic instrument such as a wind instrument, a rubbed string instrument (a bowed instrument), or the like and, more particularly, to an improvement with which a sound source circuit can always normally generate tones on the basis of input data such as positions or pressures corresponding to musical tone parameters from a performance operation member.

2. Description of the Prior Art

An electronic musical instrument which generates performance tones of a rubbed string instrument such as a violin or of a wind instrument such as a clarinet comprises a physical sound source (physically modelled sound source) for generating electronic tones obtained by physically approximating tones generated by mechanical vibrations of a string corresponding to movement of a contact between a string and a bow, or air vibrations in a mouthpiece of a wind instrument using an electrical circuit. In an electronic musical instrument of this type, pitch data of an ON key is inputted upon operation of a keyboard, and a parameter control signal corresponding to a bow pressure or a bow velocity of a bowing operation, a breath pressure or an embouchure of a blowing operation is inputted to a sound source by a performance operation member comprising, e.g., a slide volume, thereby generating and producing an electronic tone.

In a conventional electronic musical instrument, a musical tone control signal based on an operation position or an operation pressure of a performance operation member is merely multiplied with a given coefficient regardless of a velocity or pressure region, and is substantially directly inputted to a sound source.

However, when operation data of a performance operation member is directly inputted to a sound source, a tone cannot be generated or an irregular or abnormal tone such as an uncomfortable tone or a so-called falsetto tone is generated in a given operation region. Therefore, the performance operation member must be operated while avoiding generation of these irregular or abnormal tones. Thus, an electronic musical instrument is not easy to play.

The irregular tones are generated for the following reason. As for a bowed instrument, an irregular tone is generated since it does not fall within a regular tone generation region in view of the relationship between parameters of a bow pressure and a bow velocity. The relationship between a bow pressure and a bow velocity of a bowed instrument is roughly divided by four straight lines passing the origin into a regular or normal tone generation region A where a tone begins to sound, a tone duration (or tone sustaining) region B where a generated tone is sustained, and an irregular or abnormal tone region C where a tone is muted or an uncomfortable tone is generated, as shown in FIG. 2. Therefore, when a performance operation member is operated in a state corresponding to a given bow velocity $v_1$, if a bow pressure at that time is too high or too low and cannot fall within the tone generation region A, a tone cannot begin to sound. If a tone enters the irregular tone region C, a tone is muted or an uncomfortable tone or a falsetto tone is generated.

In a conventional electronic musical instrument, since operation data of a performance operation member is substantially directly inputted to a sound source, the data may enter the irregular tone region depending on an operation state, and in this case, a tone is muted or an uncomfortable tone is generated.

SUMMARY OF THE INVENTION

The present invention has been made in consideration of the conventional problems, and has as its object to provide a method of controlling a sound source for an electronic musical instrument, which can always be played in a regular tone generation state regardless of an operation state of a performance operation member.

It is another object of the present invention to provide an electronic musical instrument for simulating an acoustic instrument, which comprises a performance operation member suitable for driving a physical sound source approximating an acoustic instrument, and can always be played in a regular tone generation state regardless of an operation state of the performance operation member.

In order to achieve the above objects, a sound source control method of the present invention comprises the steps of outputting operation data of a performance operation member corresponding to musical tone control parameters of a musical instrument, converting said operation data according to a tone generation region characteristic of said musical instrument, and inputting said converted operation data to said sound source.

An electronic musical instrument of the present invention comprises performance operation means for outputting operation data corresponding to musical tone control parameters of a musical instrument, conversion means for converting said operation data outputted by said performance operation means according to a tone generation region characteristic of said musical instrument, and sound source means for receiving said converted operating data as said musical tone control parameters and for generating a musical tone based on said converted operation data, said musical tone simulating said musical instrument.

The tone generation region characteristics are expressed by a graph defined by four curves in a coordinate system in which the musical tone control parameters such as a bow pressure and a bow velocity or a breath pressure and an embouchure are plotted along the ordinate and the abscissa. In this graph, a region defined by central two of said four curves constitutes a tone generation region, regions outside the tone generation region constitute generated tone sustaining regions, and regions outside outermost two of said four curves constitute irregular tone regions. These curves may include a straight line.

According to the above arrangement, when operation data from a performance operation member falls within an irregular tone region, this data is corrected to data falling within a tone generation region, and the corrected data is inputted to a sound source.

DETAILED DESCRIPTION OF THE PREFERRED EMBODIMENTS

An embodiment of the present invention will be described in more detail with reference to the accompanying drawings.

Figure 1:
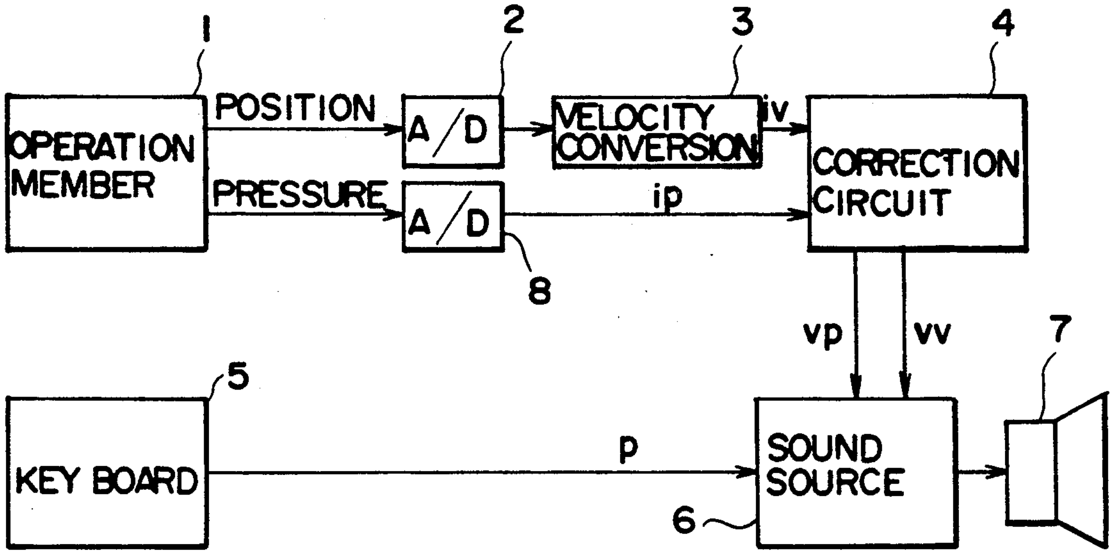
FIG. 1 is a block diagram showing a basic arrangement of an electronic musical instrument control mechanism according to the present invention.

FIG. 1 is a block diagram of an electronic bowed instrument according to the present invention. A performance operation member 1 comprises, e.g., a slide volume or a joystick mechanism or a mouse mechanism comprising a pressure sensitive means. Position data generated upon operation of the operation member 1 is converted into velocity data iv via an A/D converter 2 and a velocity conversion arithmetic circuit 3, and the velocity data is inputted to a correction circuit 4. Pressure data from the pressure sensitive means of the operation member 1 is converted into pressure data ip via an A/D converter 8, and the pressure data is inputted to the correction circuit 4.

The correction circuit 4 corrects the velocity data iv and the pressure data ip to fall within a tone generation region where a tone begins to sound in a rising state as an initial tone generation state, and inputs them as bow velocity data vv and bow pressure data vp to a sound source 6. The sound source 6 also receives pitch data p corresponding to a pitch upon operation of a keyboard 5. The sound source 6 generates an electronic tone on the basis of these bow velocity data, bow pressure data, and pitch data, thus producing an actual tone via a sound system 7.

A calculation method for correcting a tone generation region in the correction circuit 4 will be described below.

Figure 2:
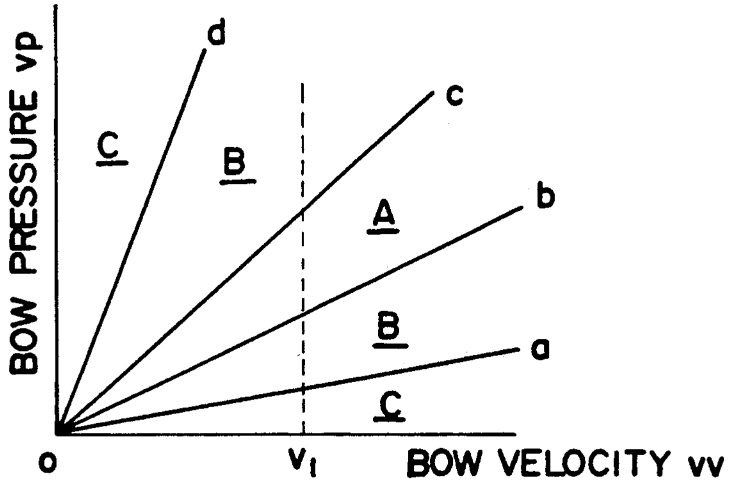
FIG. 2 is a graph showing tone generation region characteristics of a bowed string algorithm.

The relationship between a bow velocity vv and a bow pressure vp as musical tone control parameters of a bowed instrument is shown in FIG. 2, as described above. Four straight lines a, b, c, and d pass the origin, and their inclinations vary depending on pitch data from the keyboard. Therefore, a correction calculation program is executed based on a table addressed by key numbers. Each straight line varies depending on a distance between a bridge of a bowed instrument and a bowed string position. Therefore, the calculation program includes a table having the distance from the bridge as a parameter. A bow velocity has a positive/-negative value. However, a graph of the bow velocity is symmetrical about the ordinate (bow pressure), and a negative portion is omitted from FIG. 2.

In order to normally generate a tone regardless of a bow pressure, equations for correcting bow pressure vp to fall within a region A are as follows:

$$vv=iv \qquad (1)$$

$$vp=\{(c+b)/2\}\times iv \qquad (2).$$

With these calculations, if vv is not zero, the bow pressure can fall within the tone generation region A, and a tone begins to sound. In this case, a tone volume changes depending on vv, but tone quality is constant and monotonous. In addition, pressure data ip is ignored. Note that c and b represent inclinations of the straight lines c and b.

An equation for changing tone quality using pressure data ip is as follows:

$$vp=b\times iv+(c-b)\times iv\times ip/P_{max} \qquad (3).$$

Equation (3) changes a position in a vertical direction in the tone generation region A on the basis of pressure data from the operation member, thereby changing tone quality. Note that $P_{max}$ represents a maximum value of pressure data ip.

Once a physical sound source for generating an electronic tone generates a tone, it has hysteresis characteristics for sustaining regular generation of the tone even in a sustaining region B outside the tone generation region A. Therefore, it is preferable that once a tone begins to sound, the position of a parameter is widely changed over the sustaining region to provide a margin for tone quality.

An equation for widening a range of the tone generation region is as follows:

$$vp=a\times iv+(d-a)\times iv\times ip/P_{max} \qquad (4).$$

When the sound source is controlled according to equations (1) and (4), a tone can be normally generated over a wide range, and changes in tone quality and tone volume can be increased.

Figure 3:
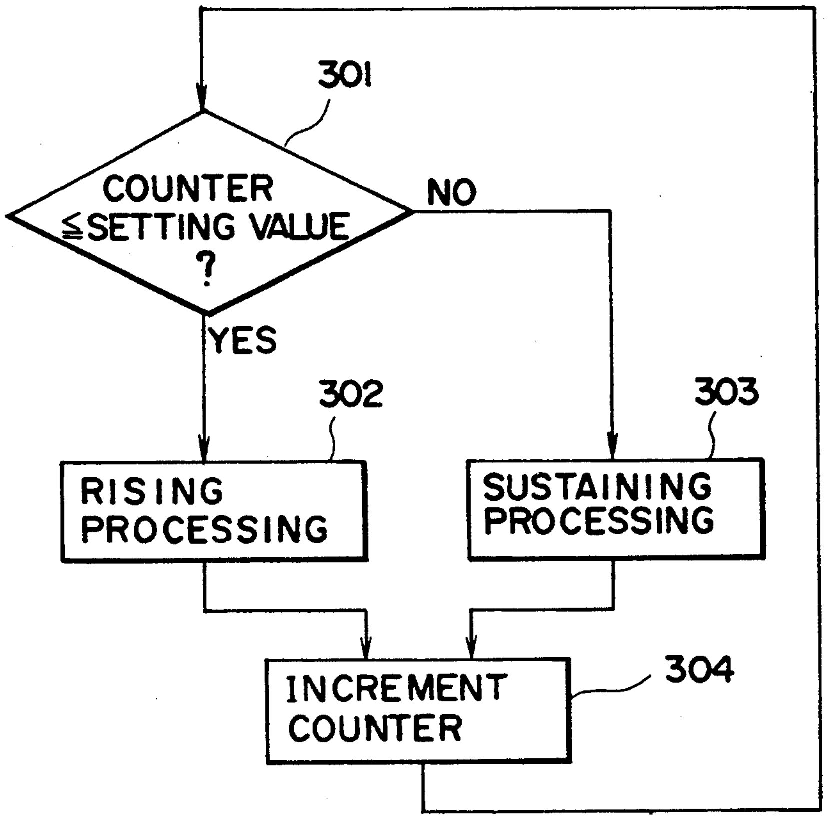
FIG. 3 is a flow chart for explaining a method of switching rising processing and sustaining processing.

FIG. 3 is a flow chart showing an operation for switching sustaining processing with a control region widened to the sustaining region B, and rising processing for causing a tone to sound.

The number of repetitions of rising processing is set in advance. It is checked in step 301 if a content of a counter reaches the setting value. If the content of the counter is equal to or smaller than the setting value, the rising processing is repeated (step 302). After the processing, the counter is incremented by one (step 304), and the flow returns to step 301. If the content of the counter reaches the setting value, sustaining processing is executed (step 303). Once the sustaining processing is executed, the sustaining processing is repeated via decision step 301 by incrementing the counter (step 304). The counter is cleared to 0 when a new tone is generated, e.g., when a key ON signal is inputted or when pressure data ip of the operation member is changed from 0 to 1.

In the correction calculations, in place of directly using ip and iv as inputs to equations (1) to (4), they are inputted through a table addressed by, e.g., key numbers and are then used as inputs to equations (1) to (4), thus allowing musical tone parameter control matching with man's feeling.

In the correction calculations, ip is generated based on iv. Contrary to this, iv may be generated based on ip. For example, the following equations (5) and (6) correspond to equations (1) and (4) described above:

$$vp=vi \qquad (5)$$

$$vv=(1/d)\times ip+\{(1/a)-(a/d)\}\times ip\times iv/V_{max} \qquad (6).$$

Where $V_{max}$ is the maximum value of iv. The equations can be selected in correspondence with performance feeling according to a musical instrument. The inclinations a, b, c, and d of the straight lines a, b, c, and d in the conversion characteristic graph shown in FIG. 2 are adjusted to adjust ranges of the respective regions, so that the region slightly includes the irregular tone region C, thereby widening a performance expression range. In this case, conversion characteristics may be set during a performance. Each of these straight lines may be a curve, and, in this case, above mentioned formulae are appropriately changed.

Figure 18:
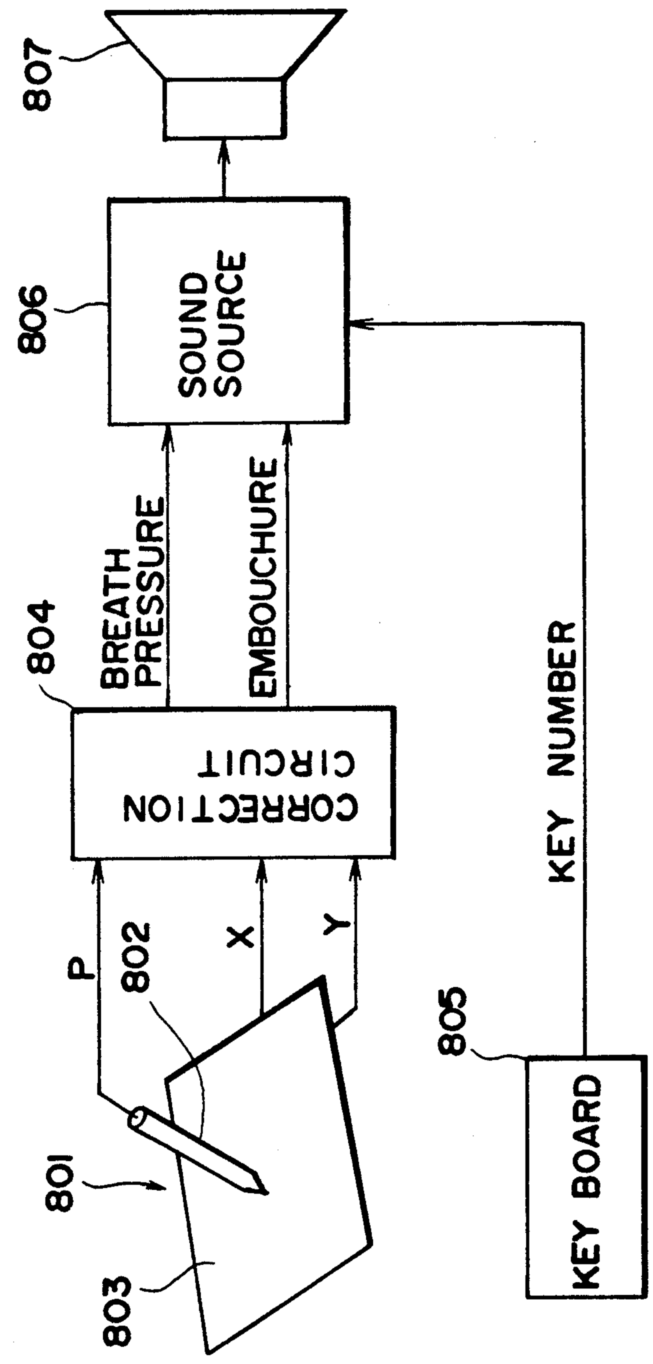
FIG. 18 is a block diagram for explaining an arrangement of an electronic musical instrument control mechanism comprising a performance operation member according to the present invention.

In the bowed instrument shown in FIG. 1, a three-dimensional tablet shown in FIG. 18 may be used as an input device (i.e., the performance operation member 1).

Figure 4:
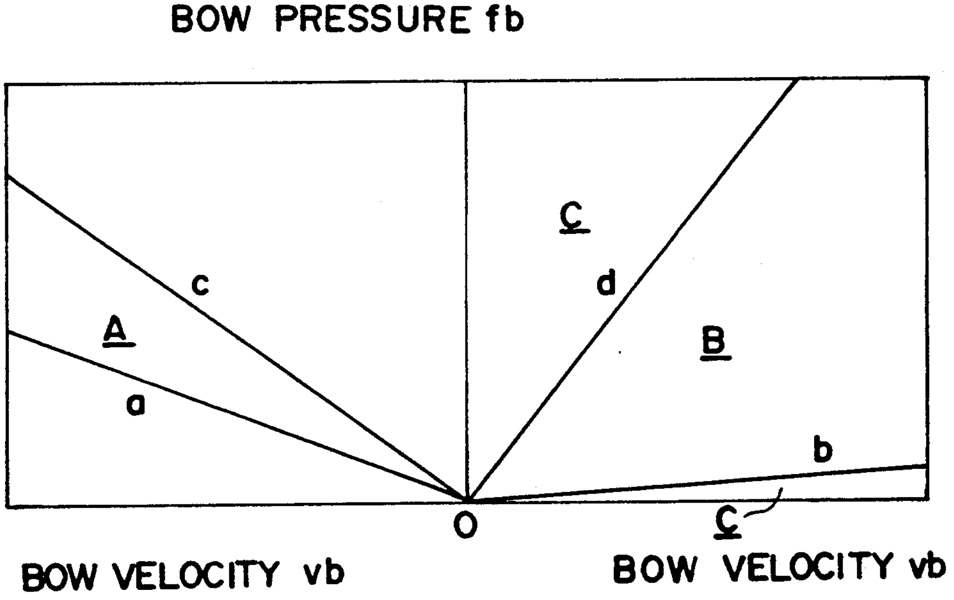
FIG. 4 is a graph showing other tone generation region characteristics the bowed string algorithm.

FIG. 4 shows a characteristics graph for tone generation correction calculations of a bowed string algorithm of an electronic bowed instrument using a three-dimensional tablet as an input device. A range between straight lines a and c corresponds to a tone generation region A where a tone begins to sound, a range between straight lines b and d corresponds to a sustaining region B where a tone is sustained, and ranges outside the straight lines b and d correspond to irregular tone regions C. Inclinations a, b, c, and d of the straight lines are changed in accordance with a bowed string point (distance from a bridge), and are also changed in accordance with key numbers. In particular, the inclination d is largely changed depending on key numbers. In this characteristic graph, when a parameter does not fall within the tone generation region A in a rising state, a tone cannot begin to sound. An equation for correcting a bow velocity based on a bow pressure to fall within the tone generation region A in a rising state is as follows:

$$vb=fb/c+\{(1/a)-(1/c)\}\times vb/v_{max}\times fb$$

where vb and fb respectively represent the bow velocity and the bow pressure. After a tone begins to sound, a parameter is controlled to fall within the sustaining region B. In a range below the straight line b, a tone is muted, and in a range above the straight line d, an uncomfortable tone is generated. An equation for correcting a bow velocity based on a bow pressure and controlling it to fall within the sustaining region B after a tone rises is as follows:

$$vb=fb/d+\{(1/b)-(1/d)\}\times vb/v_{max}\times fb.$$

Figure 5:
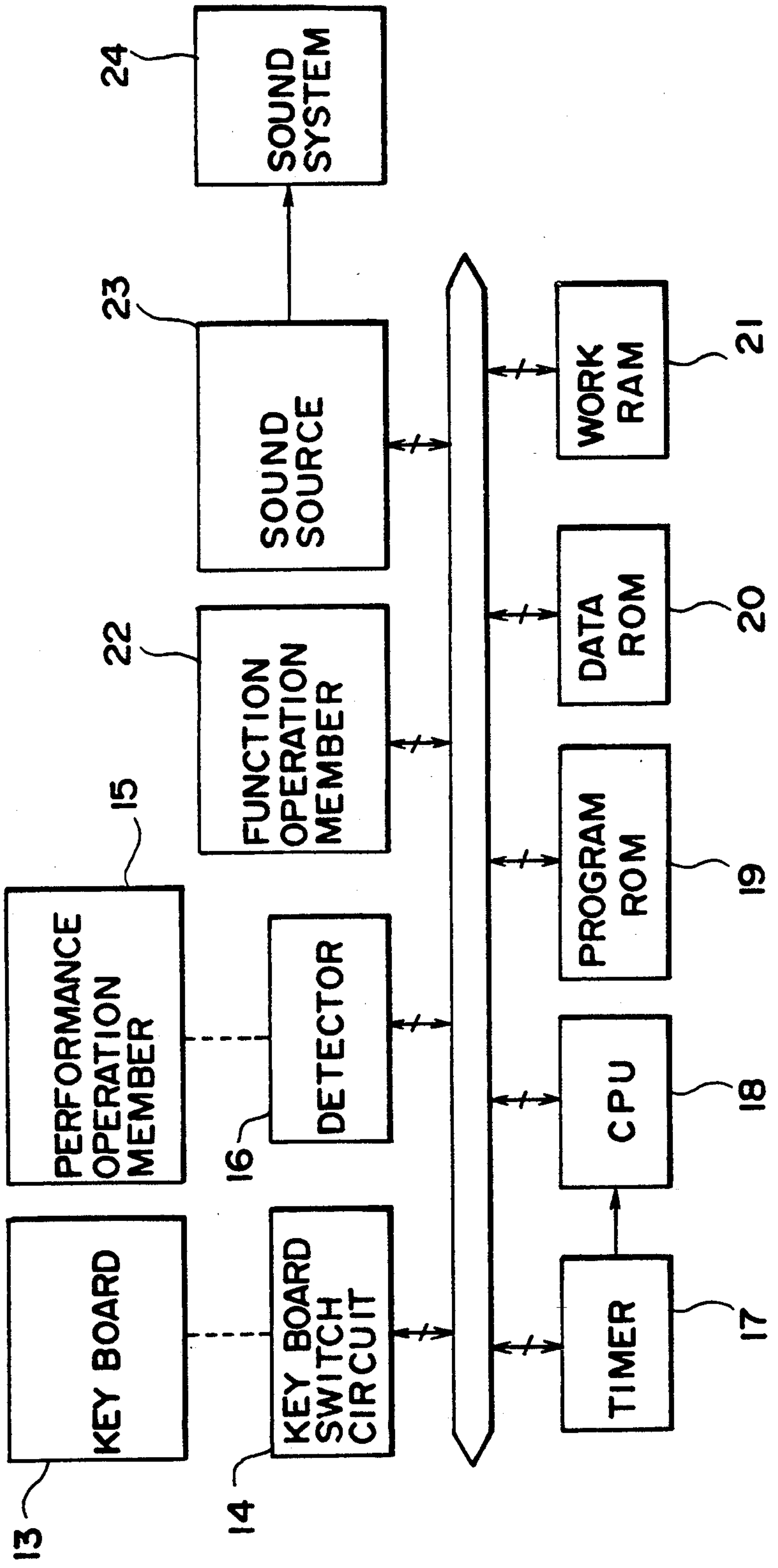
FIG. 5 is a block diagram showing a basic arrangement of an electronic musical instrument according to the present invention.

FIG. 5 is a block diagram of an electronic musical instrument comprising the above-mentioned correction circuit.

Signals from a performance operation member 15 and a keyboard 13 are inputted from a bus line to a CPU 18 via a detector 16 and a keyboard switch circuit 14, respectively. The CPU 18 reads out necessary data from a program ROM 19 for storing routine programs, a data ROM 20 for storing data necessary for arithmetic processing, and a work RAM 21 for storing calculation results during the arithmetic processing, and calculates musical tone control parameters subjected to the above-mentioned correction calculations. A function operation member 22 is normally used to select tone colors, vibrato levels, and the like, and to switch various modes. For example, the member 22 switches between a bow position detection mode and a bow velocity detection mode. A timer 17 executes an interrupt routine at a fixed cycle of about several ms with respect to the main routine of a program executed by the CPU 18.

Figure 6:
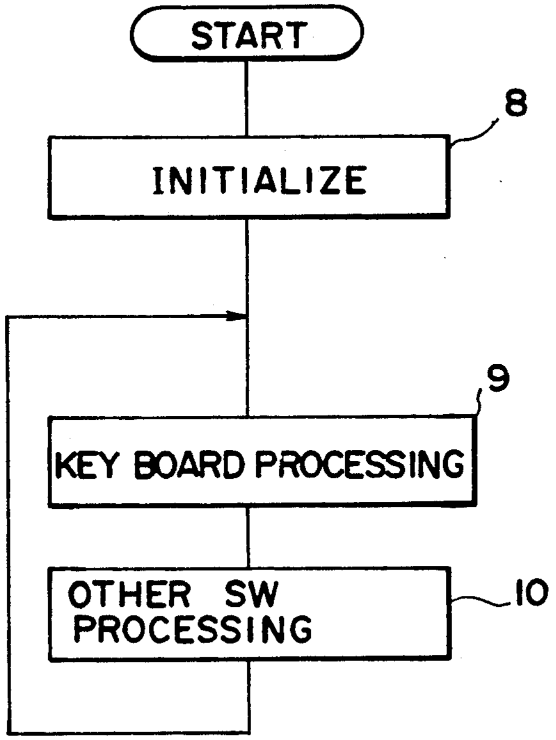
FIG. 6 is a flow chart of a main routine of program control according to a method of the present invention.

FIG. 6 shows a basic main routine. In step 8, arithmetic circuits are initialized, and sound source parameters are set to be predetermined initial values. Subsequently, key switch processing of the keyboard (step 9) and other switch processing (step 10) are repeated. The timer 17 executes an interrupt routine (to be described later) at a predetermined cycle with respect to this main routine, thus executing the above-mentioned correction calculations.

Figure 7:
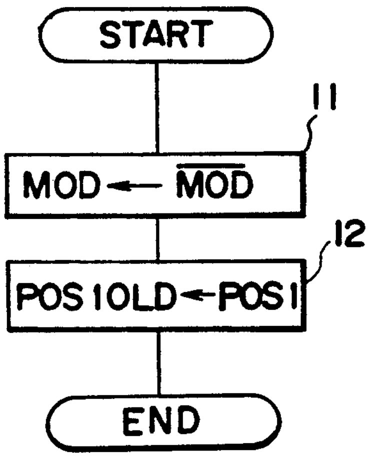
FIG. 7 is a flow chart of a mode switching routine.

FIG. 7 shows a mode switching routine. In step 11, a mode such as a detection mode is switched, and a detection result is stored in a register for the next detection arithmetic processing (step 12).

Figure 8:
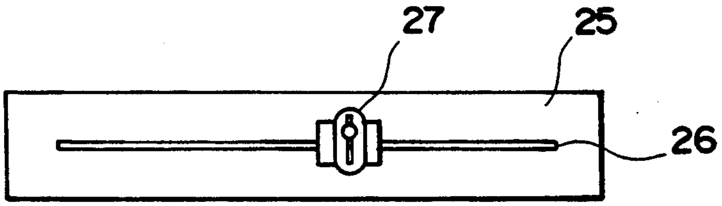
FIG. 8 is a top view of a slide volume type performance operation member.
Figure 9A:
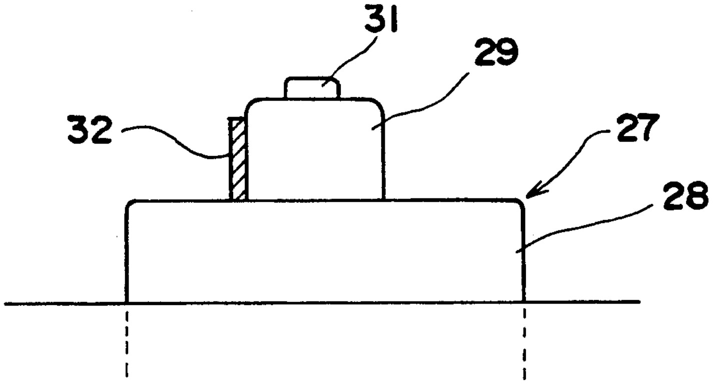
FIGS. 9A and 9B are a side view and a top view of a main part of the performance operation member shown in FIG. 8.
Figure 9B:
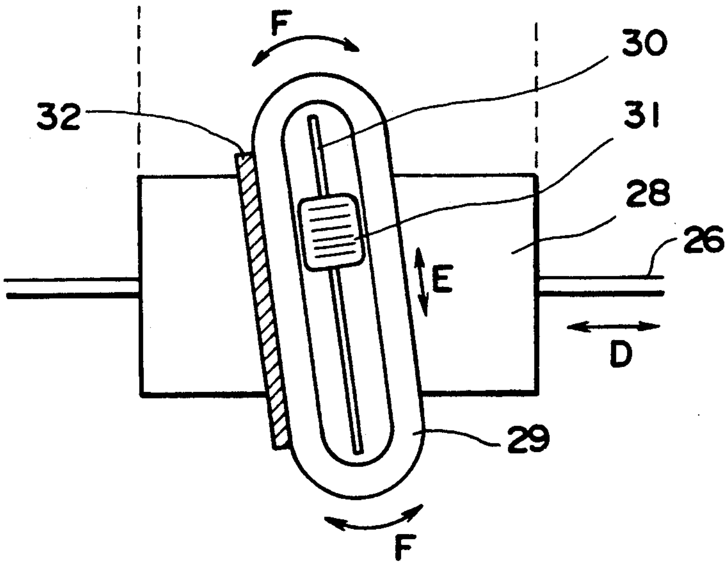

FIGS. 8 to 9B show an arrangement of a musical parameter control input device of an electronic musical instrument according to the present invention. FIG. 8 is a top view, and FIGS. 9A and 9B are respectively an enlarged side view and an enlarged top view of a main part. This input device is a slide volume type operation member. An operation member 27 slides along a central guide groove 26 of a main body 25 constituting a first slide volume. The operation member 27 comprises a slider 28 which slides along the guide groove 26 as indicated by an arrow D, and an operation element 29 mounted on the slider 28, as shown in FIGS. 9A and 9B. The operation element 29 is preferably rotatable about the slider 28 to allow a smooth slide operation, as indicated by an arrow F. In this case, a rotational angle may be detected, and may be used as musical tone control data. The operation element 29 constitutes a second slide volume. A slider 31 slides along a guide groove 30 of the operation element 29, as indicated by an arrow E. First position data can be obtained based on a resistance according to the position of the operation member 27, and second position data can be obtained based on a resistance according to the position of the slider 31.

A pressure sensor 32 is mounted on the side surface of the operation element 29 to measure an operation pressure, thus obtaining pressure data. Musical tone control parameters are calculated based on these two position data, and pressure data, and the above-mentioned correction calculations are performed.

Figure 10:
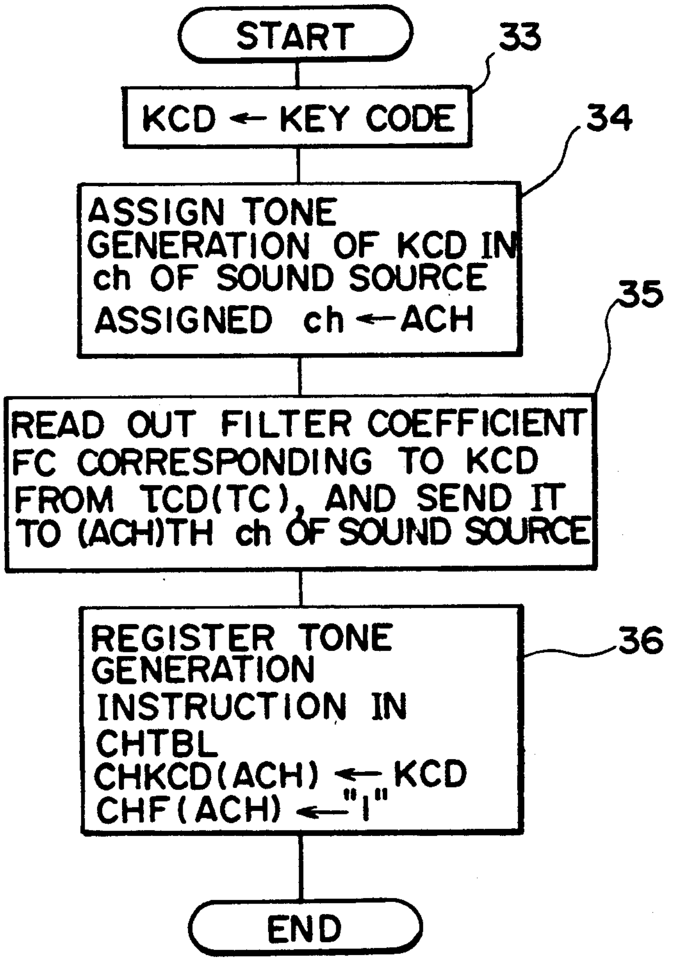
FIG. 10 is a flow chart of a key ON routine.

FIG. 10 shows a key ON routine executed by the CPU. A key code of an ON key is stored in a key code register KCD (step 33). A tone generation channel of a sound source is then assigned. The assigned channel is stored in an assign channel register ACH (step 34). A filter coefficient FC of a musical tone control filter circuit (to be described later), which coefficient corresponds to the key code stored in the register KCD, is read out based on predetermined read management data TCD, and is sent to the assigned channel ACH of the sound source (step 35). Tone generation is instructed to the assigned channel CHKCD(ACH), and the channel is registered (step 36). At this time, a signal "1" is inputted to a flag CHF(ACH) of the registered channel.

Figure 11:
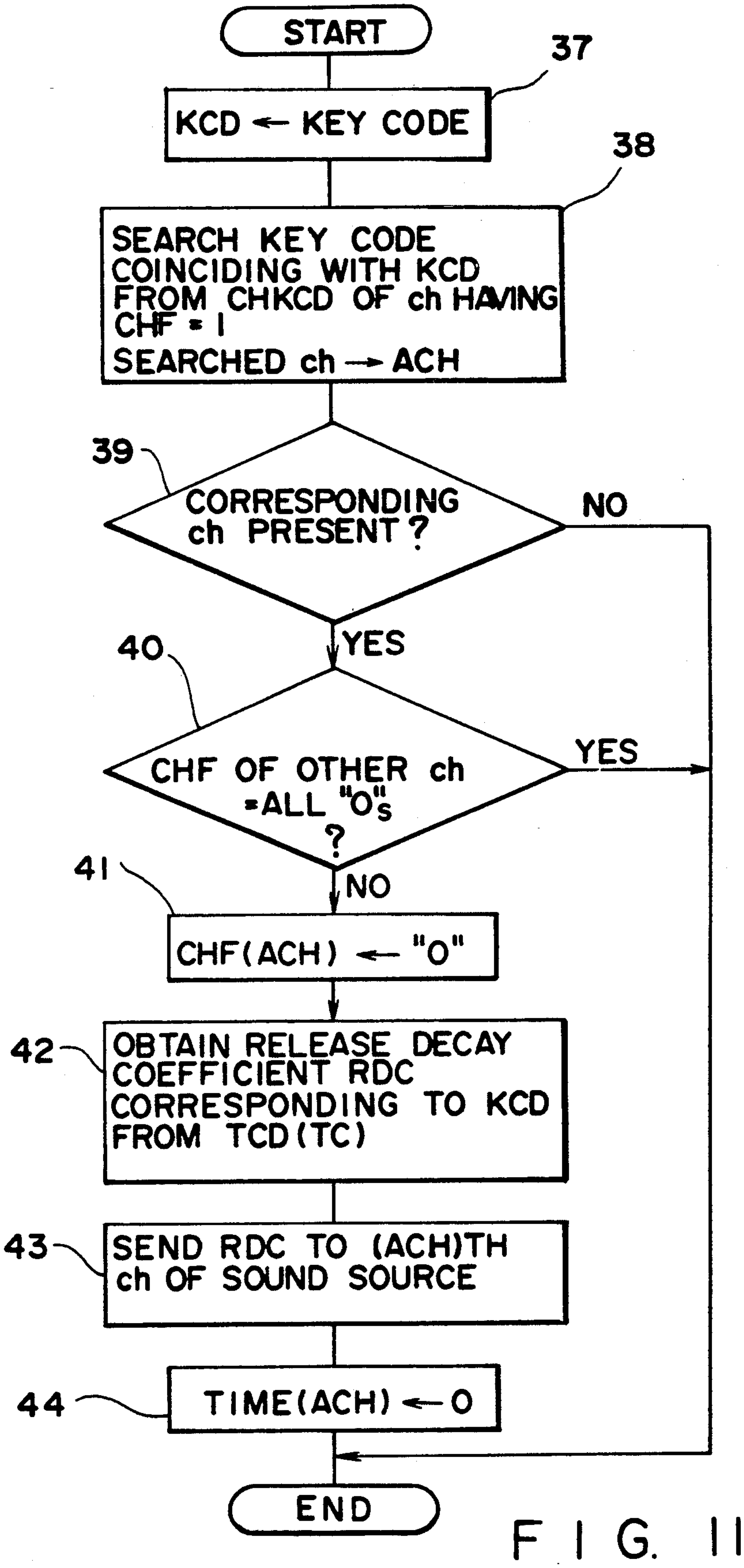
FIG. 11 is a flow chart of a key OFF routine.

FIG. 11 shows a key OFF routine. A key code of an OFF key is stored in the register KCD (step 37). A tone generation channel of the sound source to which the key code is assigned is searched using a channel table CHTBL (step 38). The presence/absence of such a channel is checked in decision step 39. If NO in step 39, the routine is ended; otherwise, it is checked if other channels are all "0" s (step 40). If flags of other channels are all "0"s, the routine is ended; otherwise, "0" is inputted to the flag of the assigned channel (step 41). A release decay coefficient of a tone corresponding to the OFF key code is read out from a read table (step 42). The readout decay coefficient RDC is sent to the assigned channel (step 43). A processing count of the assigned channel is cleared to "0", and the routine is ended (step 44).

Figure 12:
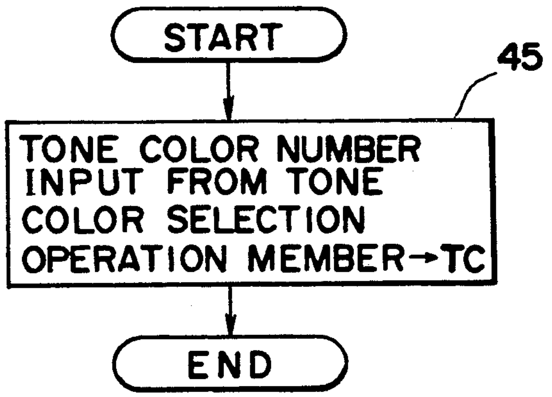
FIG. 12 is a flow chart for explaining a tone color selection operation.

FIG. 12 shows a tone color selection routine. A tone color number transmitted from a tone color selection operation member (e.g., a selection switch on an instrument main body or the above-mentioned performance operation member) is inputted to a predetermined register TC (step 45).

Figure 13:
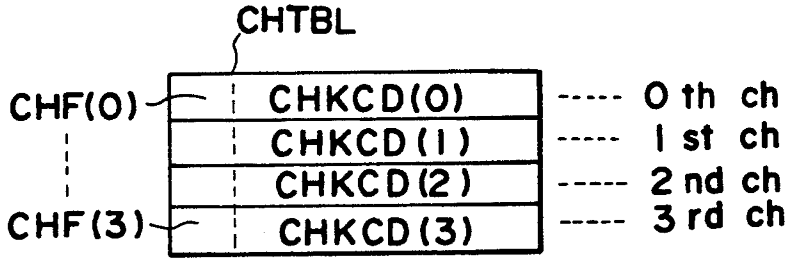
FIG. 13 is a view for explaining a channel register table.

FIG. 13 shows a register table CHTBL for managing tone generation channels CHKCD (0)-(3) of the sound source. In this case, the sound source has four channels in correspondence with the number of strings of a violin. In this manner, since a plurality of sound sources are arranged, when a key ON signal shifts from a given channel to another channel, a reverberation effect of an original channel can be obtained. When a channel flag CHF(i) is checked in each routine, a number i is set, and is incremented by one from initial number "0". This check processing is repeated four times until i becomes 3.

Figure 14:
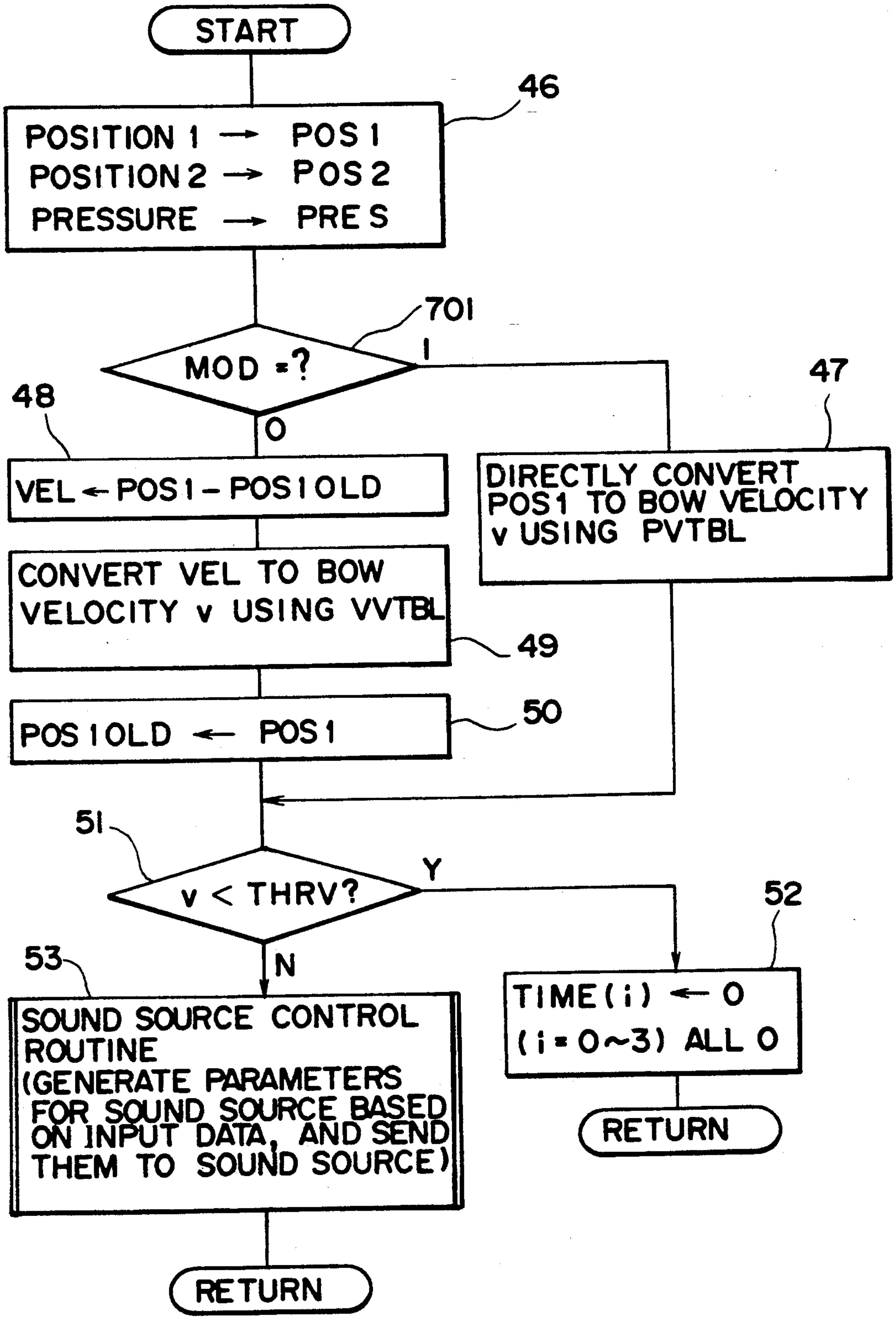
FIG. 14 is a flow chart of a timer interrupt routine.

FIG. 14 shows an interrupt routine which interrupts the main routine at predetermined time intervals based on fixed clocks. Upon operation of the above-mentioned slide volume type performance operation member (FIGS. 8 to 9B), first and second position data, and pressure data are stored in predetermined registers POS1, POS2, and PRES (step 46). In step 701, a mode MOD is determined. If the mode MOD is "1", a bow velocity v is directly obtained from the first position data POS1 of the operation member using a conversion table PVTBL which is created and stored in advance (step 47).

If it is determined in step 701 that the mode MOD is "0", a velocity is obtained based on a difference between previous and present first position data POS-1OLD, POS1, and is stored in a register VEL (step 48). In this case, since detection timings are constant, a difference between two positions directly corresponds to a velocity. The velocity data VEL is converted into a bow velocity v using another conversion table VVTBL which is created and stored in advance (step 49). When the bow velocity v is obtained, the present first position data POS1 is stored in predetermined register for the next calculations (step 50).

The bow velocity v obtained as described above is compared with a predetermined threshold value THRV (step 51). If the velocity is smaller than the threshold value, it is ignored as noise, and "0" is inputted to a processing count TIME(i) of each channel (step 52). If the bow velocity v is larger than the threshold value, a sound source control routine is executed using this bow velocity v (step 53). In this routine, parameters of the sound source are calculated on the basis of input data, and are sent to the sound source, as will be described later.

Figure 15:
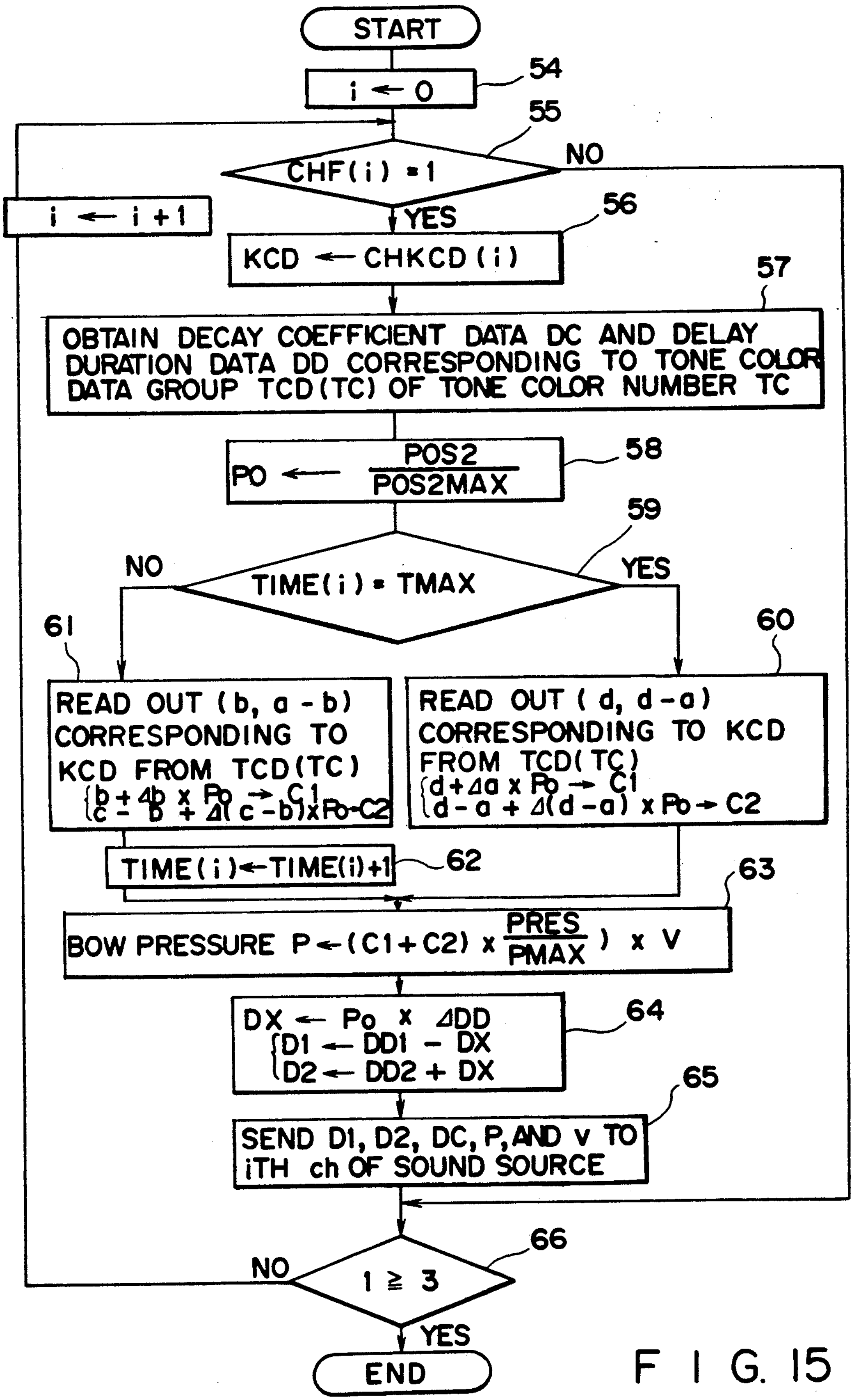
FIG. 15 is a flow chart of a sound source control routine.

FIG. 15 shows the sound source control routine. This routine is first executed from the channel "0" of the above-mentioned channel table CHTBL (FIG. 13) (step 54). It is then checked if the flag CHF(i) of this channel is "1", i.e., if this channel is the one to be controlled (step 55). If NO in step 55, the above check processing is repeated for the remaining three channels (step 66). If YES in step 55, the key code CHKCD(i) of this channel is stored in the register KCD (step 56). Decay coefficient data DC and delay duration data DD corresponding to the key code are obtained from tone color data group TCD(TC) of the input tone color number (see FIG. 12) (step 57). Predetermined calculations are performed using the second position data POS2, and a calculation result is stored in a register PO (step 58). POS2MAX represents the maximum value at the second position data POS2. It is then checked if a rising processing count TIME(i) reaches a predetermined setting value TMAX (step 59). If NO in step 59, inclinations b and c−b of straight lines corresponding to the key code KCD are read out from tone color data group TCD(TC) so as to cause a control parameter to fall within the tone generation region A (FIG. 2) of tone color (tone generation) characteristics, and predetermined calculations for obtaining C1 and C2 shown in FIG. 15 are performed (step 61). The terms "+Δb×Po" and "+Δ(c−b)×Po" in step 61 and "+Δa×Po" and "+Δ(d−a)×Po" in step 60 are added for scaling the bow pressure value on the basis of a distance between a bow position and the bridge of the bowed instrument. Upon completion of the calculations, a processing count TIME(i) is incremented by one (step 62).

On the other hand, if it is determined in step 59 that the processing count TIME(i) reaches the predetermined setting value TMAX, inclinations a and d-a of straight lines corresponding to the key code KCD are read out from the tone color data group TCD(TC) to cause the control parameter to fall within the range of the two sustaining regions B (FIG. 2) of the tone generation characteristics, and predetermined calculations for obtaining C1 and C2 shown in FIG. 15 are performed (step 60).

A bow pressure P is calculated based on the above-mentioned C1 and C2 (step 63). Furthermore, data D1 and D2 for controlling two delay circuits of the sound source circuit (to be described later) are calculated (step 64). The data D1 and D2 are sent to a processing channel of the sound source together with data DC (two decay coefficients), P (bow pressure), and v (bow velocity) (step 65). In FIG. 15, DD1 and DD2 represent delay standard durations of the two delay circuits, and ΔDD represents a change width of a bow position. The above-mentioned processing operations are repeated for four channels (step 66).

Figure 16:
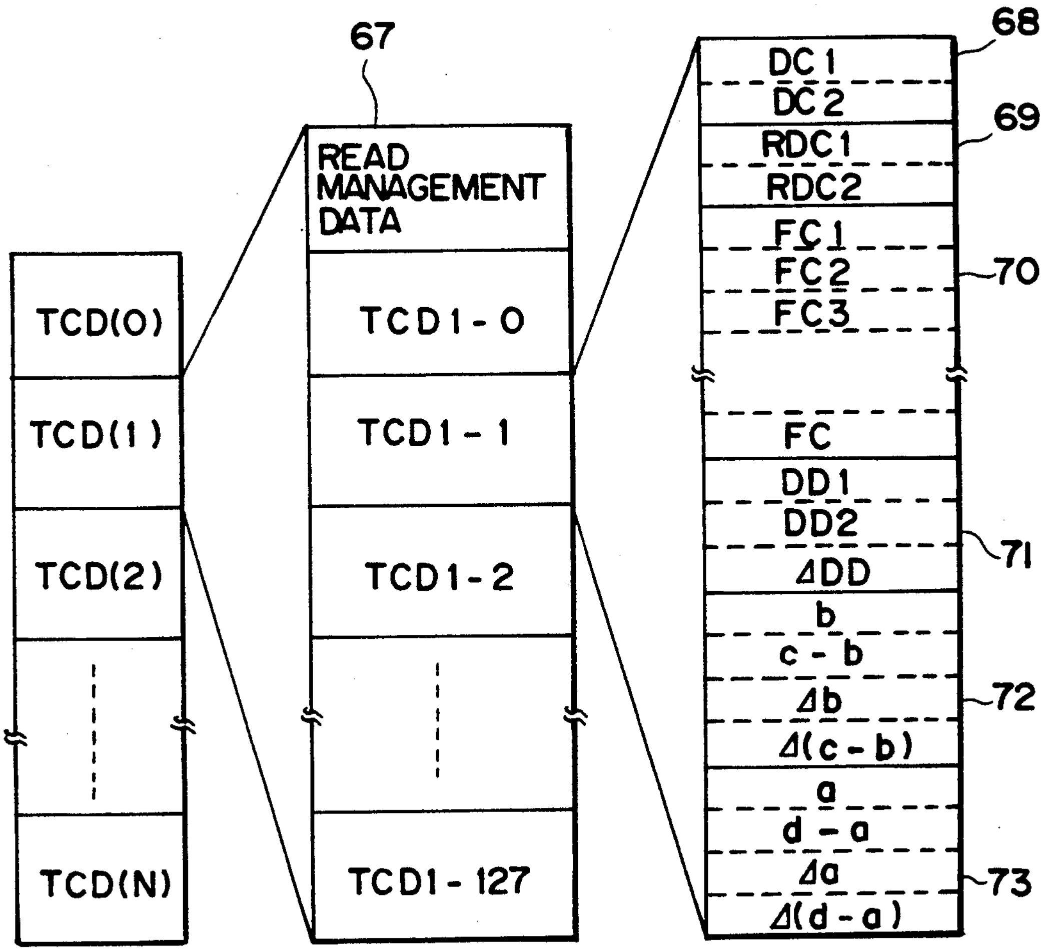
FIG. 16 is a view for explaining a read management data table.

FIG. 16 shows a register table storing the above-mentioned tone color data group TCD(TC). Reference numeral 67 denotes read management data areas TCD1-0 - - -127 which correspond in number to key codes. Each management data area stores a decay coefficient data register 68, a release decay coefficient data register 69, a filter coefficient data register 70, a delay duration data register 71, a v-p conversion data register 72 for a rising state, and a v-p conversion data register 73 for a sustaining state.

Figure 17:
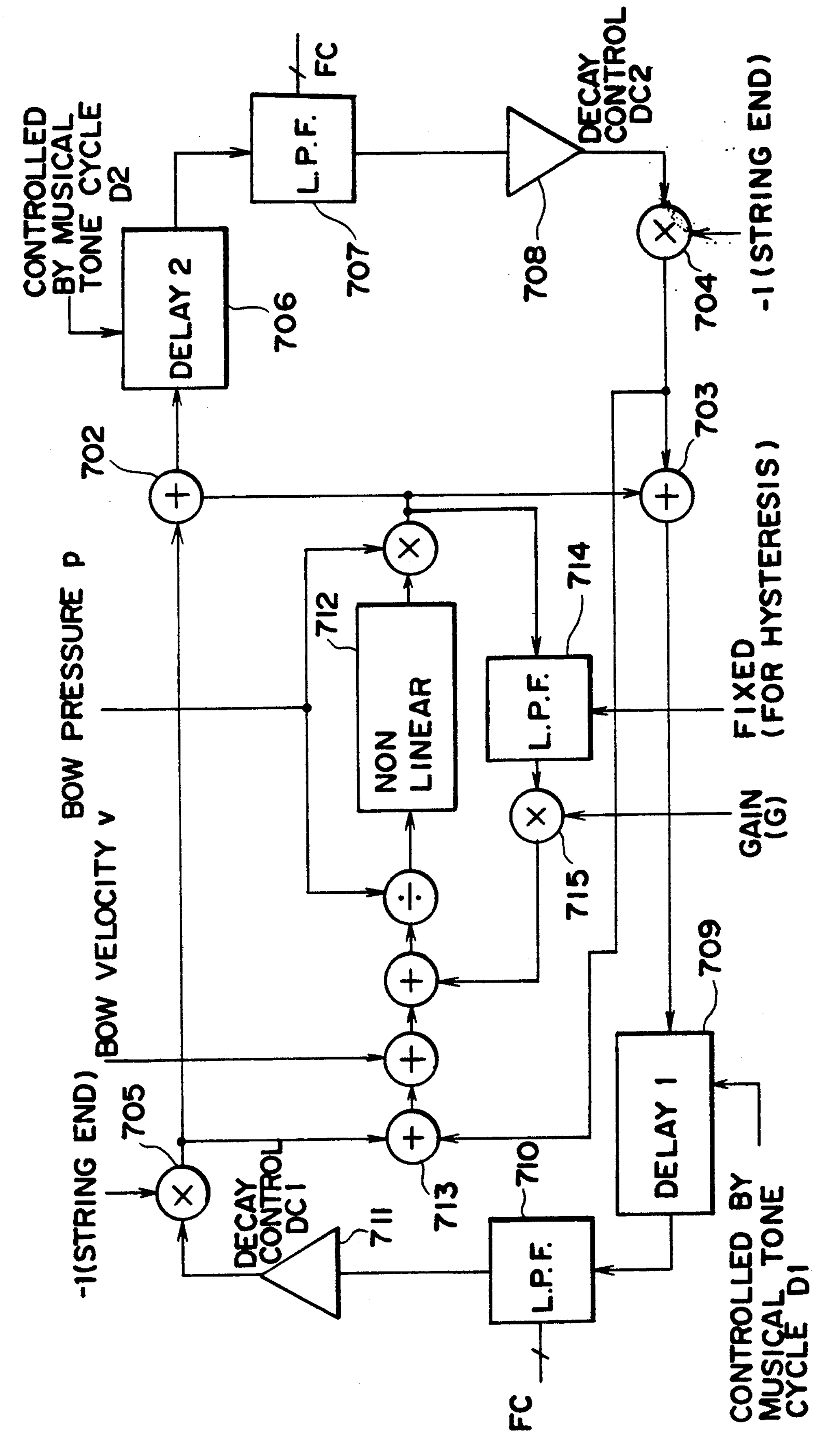
FIG. 17 is a circuit diagram of a sound source circuit of a bowed instrument.

FIG. 17 shows an example of the sound source shown in FIG. 5, which is a physical sound source for simulating a rubbed string instrument. In FIG. 17, reference numerals 702 and 703 denote adders which correspond to a bowed string point. Reference numerals 704 and 705 denote multipliers which correspond to string ends on two sides of the bow string point. A closed loop consisting of the adder 702, a delay circuit 706, a low-pass filter 707, an attenuator 708, and the multiplier 704 corresponds to a string portion on one side of the bowed string point, and a delay time of the closed loop corresponds to a resonance frequency of the string. Similarly, a closed loop consisting of the adder 703, a delay circuit 709, a low-pass filter 710, an attenuator 711, and the multiplier 705 corresponds to a string portion on the other side of the bowed string point. Reference numeral 712 denotes a nonlinear function generator. The nonlinear function generator 712 receives a signal obtained by adding a signal corresponding to a bow velocity to a signal obtained by synthesizing outputs from the closed loops on two sides of the bowed string point by an adder 713, and adding a signal obtained by multiplying a signal from a fixed hystereisis low-pass filter 714 with a gain G by a multiplier to the sum signal. Hysteresis control of the nonlinear function generator 712 is performed by a signal corresponding to the bow pressure.

FIG. 18 is a block diagram of an electronic wind instrument according to the present invention. A performance operation member 801 comprises a three-dimensional tablet device, and consists of a pen 802, and a tablet 803. The performance operation member 801 outputs X- and Y-coordinate position data signals X and Y on the tablet 803, and a pressure data signal P based on a writing pressure using the pen 802. The position data signals X and Y, and the pressure data signal P are inputted to a correction circuit 804.

The correction circuit 804 corrects the position data and the pressure data to fall within a tone generation region where a tone begins to sound in a rising state as an initial tone generation state, converts them into a breath pressure parameter and an embouchure parameter, and inputs these parameters to a sound source 806. The sound source 806 also receives pitch data (key number) corresponding to a scale upon operation of a keyboard 805. The sound source 806 generates an electronic tone on the basis of these breath pressure data, embouchure data, and pitch data, and produces an actual sound via a sound system 807.

Figure 19:
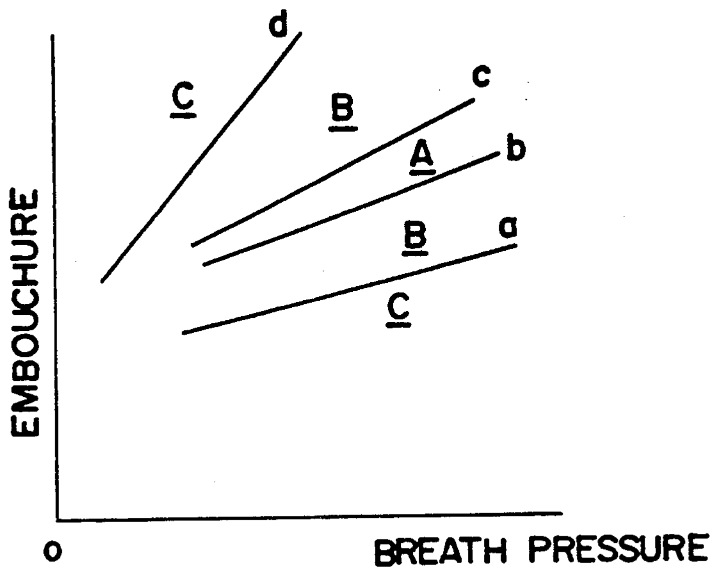
FIG. 19 is a graph showing tone generation region characteristics of a wind instrument algorithm.

An embodiment wherein the present invention is applied to control of a sound source for an electronic wind instrument will be described below. In a wind instrument algorithm, tone generation characteristics based on the relationship between an embouchure and a breath pressure corresponding to the tone generation characteristic graph (FIG. 2) of the above-mentioned bowed instrument are approximated, as shown in FIG. 19. Unlike in the bowed instrument, four straight lines do not pass the origin, and have line segments. Like in the bowed instrument, a range between two central straight lines b and c corresponds to a tone generation region A, ranges outside these straight lines correspond to sustaining regions, and ranges outside two outermost straight lines a and d correspond to irregular tone regions C. Inclinations of these straight lines are largely varied depending on pitches.

Figure 20:
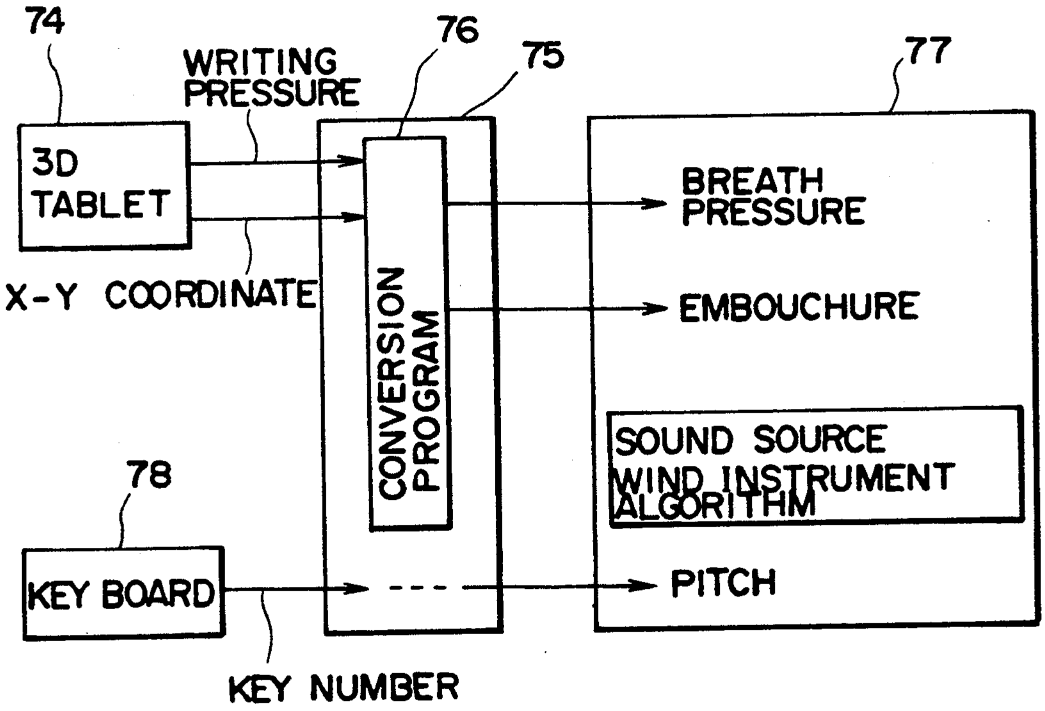
FIG. 20 is a block diagram showing a basic arrangement of an electronic wind instrument using a three-dimensional tablet.

FIG. 20 shows an arrangement of a control system for correcting a control signal from a performance operation member on the basis of tone generation region characteristics unique to a wind instrument, and inputting the corrected signal to a sound source. As an input device, a performance operation member 74 comprising a three-dimensional tablet is used. Writing pressure data obtained by gripping the performance operation member, and X-Y coordinate data representing X and Y positions are inputted to a tone generation region correction conversion program 76 of a detector 75. The input data are converted into breath pressure data and embouchure data which have values falling within a predetermined regular tone generation region by the conversion program 76. The converted data are inputted to a sound source controller 77.

The sound source controller 77 receives a key number as pitch data upon operation of a keyboard 78.

Like in the bowed instrument, once a physical sound source for generating an electronic tone generates a tone, it has hysteresis characteristics for sustaining regular generation of the tone even in a sustaining region B outside the tone generation region A. Therefore, it is preferable that once a tone begins to sound, the position of a parameter is widely changed over the sustaining region to provide a margin for tone quality.

Figure 21:
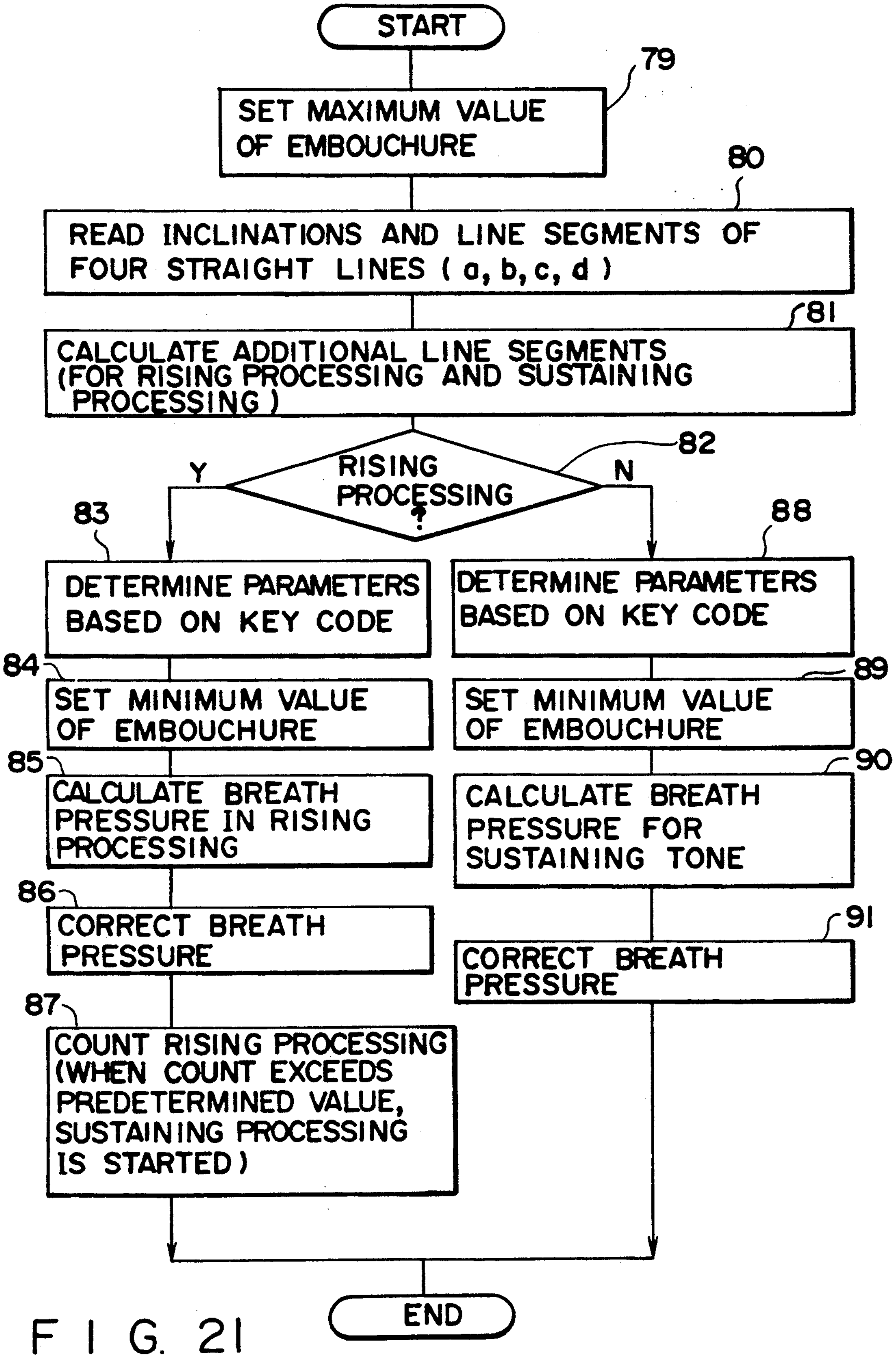
FIG. 21 is a flow chart showing a processing switching operation when a tone generated by the electronic wind instrument rises and is sustained.

FIG. 21 shows a switching discrimination flow of rising processing for causing a tone to begin to sound, and sustaining processing after the rising processing. A maximum value of embouchure data is set (step 79). Inclinations and line segments of the four straight lines a, b, c, and d (FIG. 19) are read out from a predetermined table (step 80). Additional line segments for rising processing and sustaining processing are calculated (step 81). Whether or not rising processing is executed is checked in step 82. This check operation is attained by counting the number of rising processing operations, and checking if a count value reaches a predetermined setting value. If Y (YES) in step 82, parameters are determined based on a key code (step 83). A minimum value of embouchure data is set (step 84), a breath pressure in the rising processing is calculated (step 85), and the breath pressure is corrected (step 86). After the breath pressure is corrected, the rising processing count is incremented (step 87). If the count value exceeds the predetermined setting value, control is switched to the sustaining processing. Thus, parameters are determined based on a key code (step 88), and a minimum value of embouchure data is set (step 89). In addition, a breath pressure for sustaining a tone is calculated (step 90), and the breath pressure is corrected (step 91).

Figure 22:
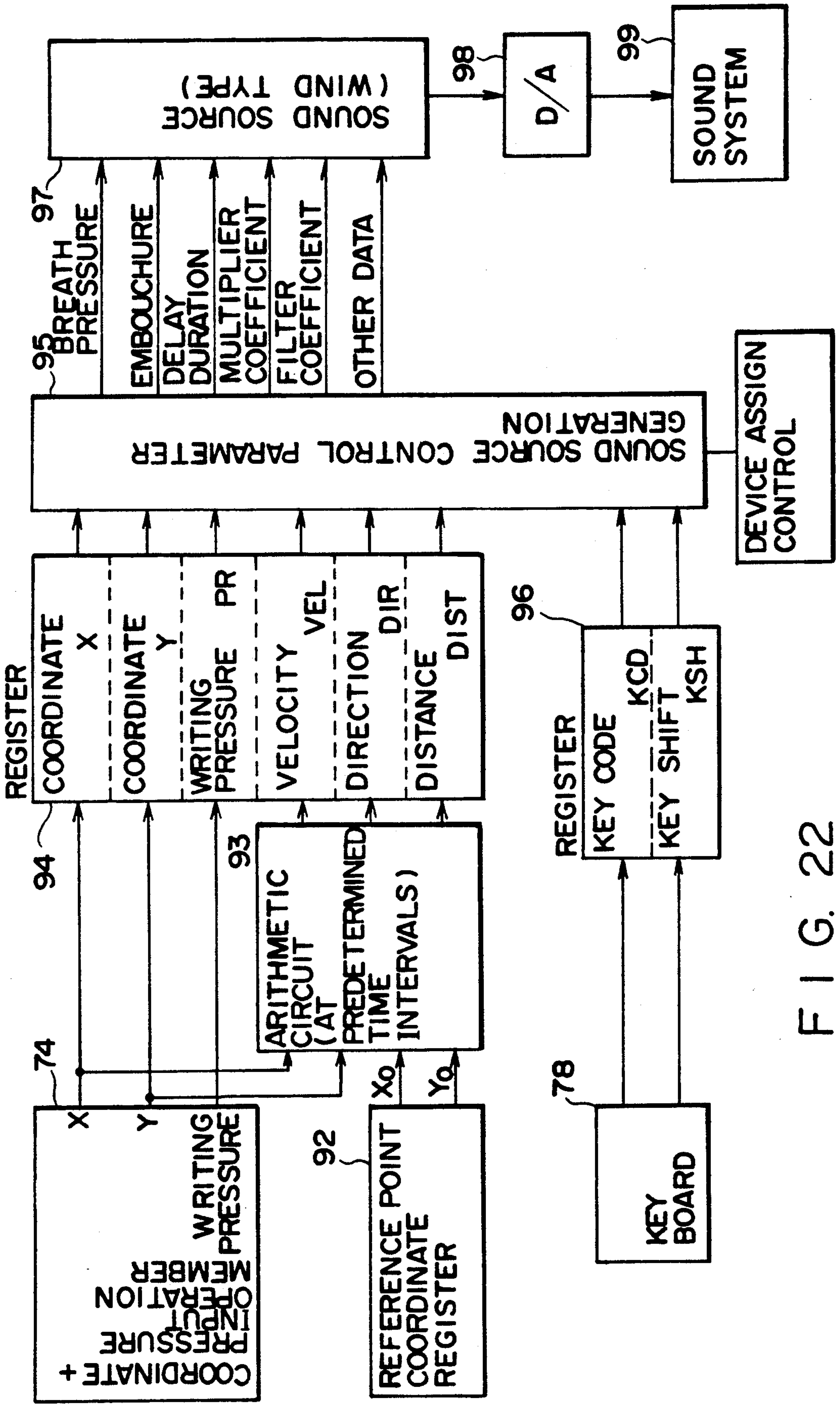
FIG. 22 is a block diagram of a sound source control mechanism of the electronic wind instrument.

FIG. 22 is a block diagram of a sound source control system for a wind instrument type electronic musical instrument according to the present invention. X- and Y-position data, and writing pressure data are outputted from a performance operation member 74 comprising a three-dimensional tablet, and are stored in corresponding registers 94. The X- and Y-coordinate data are also inputted to an arithmetic circuit 93 to calculate a velocity, a direction, and a distance at predetermined time intervals using reference coordinates $X_0$ and $Y_0$ stored in a reference point coordinate register 92, and the obtained data are stored in the corresponding registers 94. The registers 94 are connected to a musical tone control parameter calculation circuit 95.

A keyboard 78 outputs key code data representing a scale, and key shift data for shifting parameter values in a positive/negative direction, and these data are stored in registers 96. These registers 96 are also connected to the musical tone control parameter calculation circuit 95.

The musical tone control parameter calculation circuit 95 reads out data necessary for calculations from the registers 94 and 96, and calculates parameters, i.e., breath pressure data, embouchure data, delay duration data, multiplier coefficient data, filter coefficient data, and other data. The circuit 95 then sends the calculated data to a sound source 97. The sound source 97 produces the generated electronic tone from a sound system 99 via a D/A converter 98.

Figure 23:
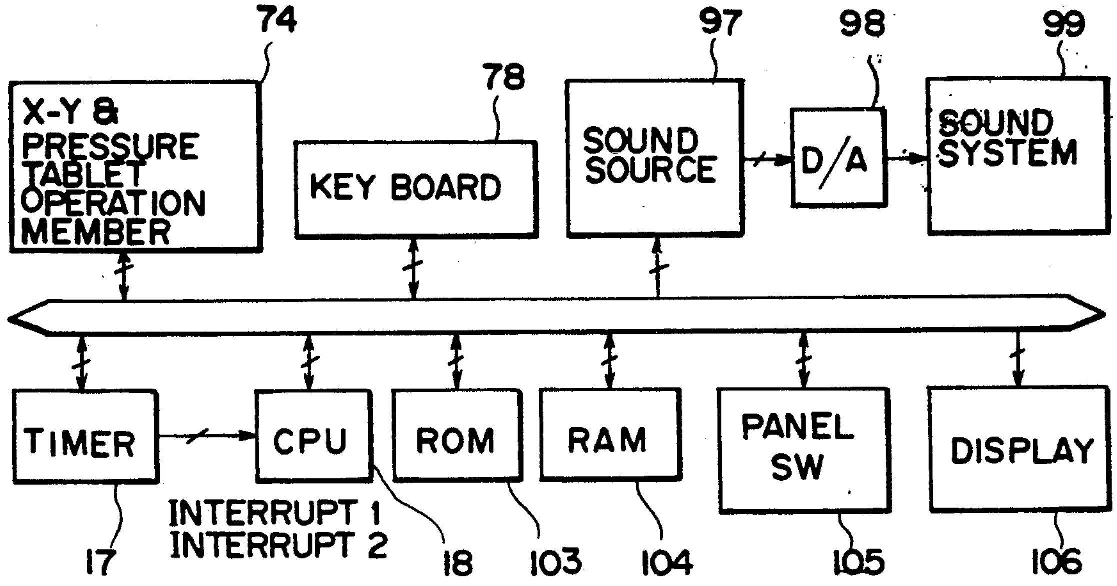
FIG. 23 is a block diagram showing a basic arrangement of the electronic wind instrument.

FIG. 23 is a block diagram of an electronic wind instrument according to the present invention. Signals from a performance operation member 74 and a keyboard 78 are inputted to a CPU 18 via a bus line. The CPU 18 reads out necessary data from a ROM 103 for storing routine programs, and data necessary for arithmetic processing, and a RAM 104 for storing calculation results during arithmetic processing, and calculates musical tone control parameters. A panel switch 105 is used to select tone colors, vibrato levels, and the like, and to switch various modes. A display 106 displays a selected switch or mode. A timer 17 executes an interrupt routine at a fixed cycle of about several ms with respect to the main routine of a program executed by the CPU 18.

Figure 24:
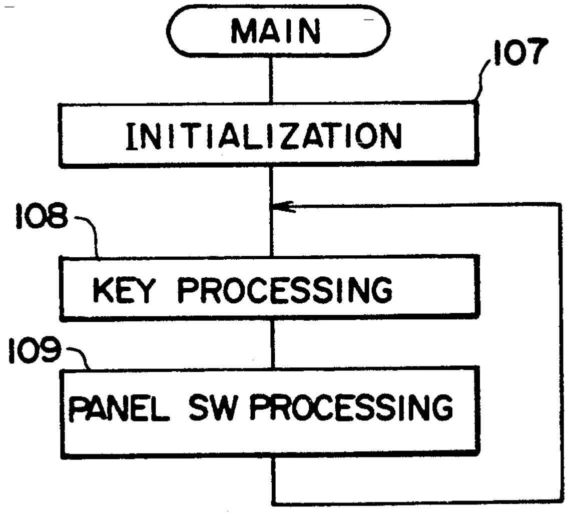
FIG. 24 is a flow chart for explaining a main routine of a sound source control program.

FIG. 24 shows a basic main routine. In step 107, arithmetic circuits are initialized, and sound source parameters are set to be predetermined initial values. Subsequently, key switch processing of the keyboard (step 108) and other switch processing (step 109) are repeated. The timer executes an interrupt routine (to be described later) at a predetermined cycle with respect to this main routine, thus calculating the above-mentioned various control parameters.

Figure 25:
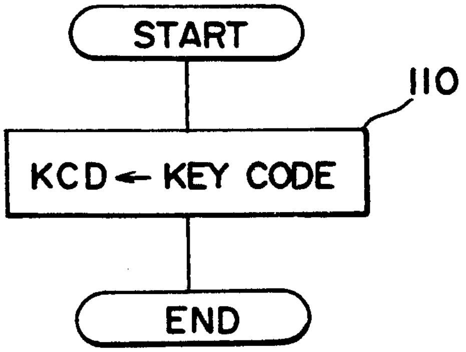
FIG. 25 is a flow chart for explaining a key ON routine.

FIG. 25 shows a key ON event routine executed when the keyboard is depressed in step 108 in the main routine. A key code of an ON key is stored in a register KCD (step 110).

Figure 26:
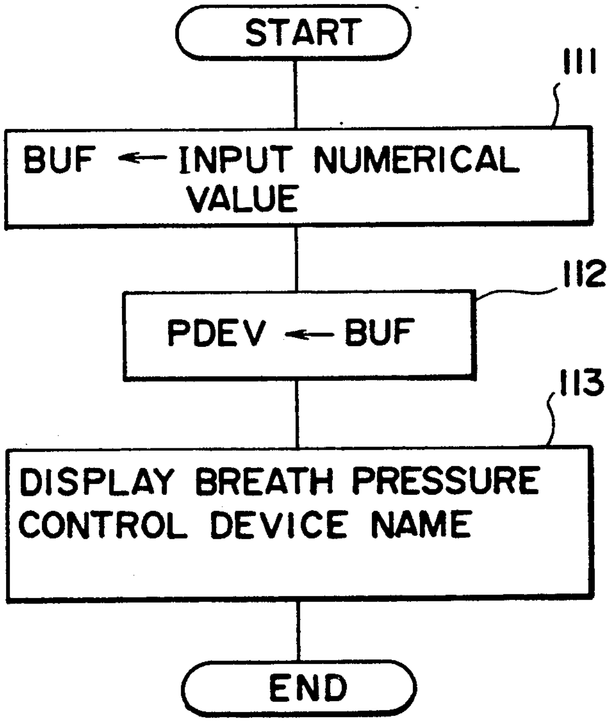
FIG. 26 is a flow chart executed when a breath pressure associated device is to be associated device is to be assigned.

FIG. 26 shows a routine executed when a numerical input to a breath pressure control device for setting parameters associated with a breath pressure in step 109 in the main routine is ON. An input numerical value is stored in a register BUF (step 111). The data in the register BUF is stored in a breath pressure device register PDEV (step 112). Subsequently, a breath pressure control device name is displayed (step 113). In this embodiment, devices (operation data) for controlling, e.g., a breath pressure can be arbitrarily selected.

Figure 27:
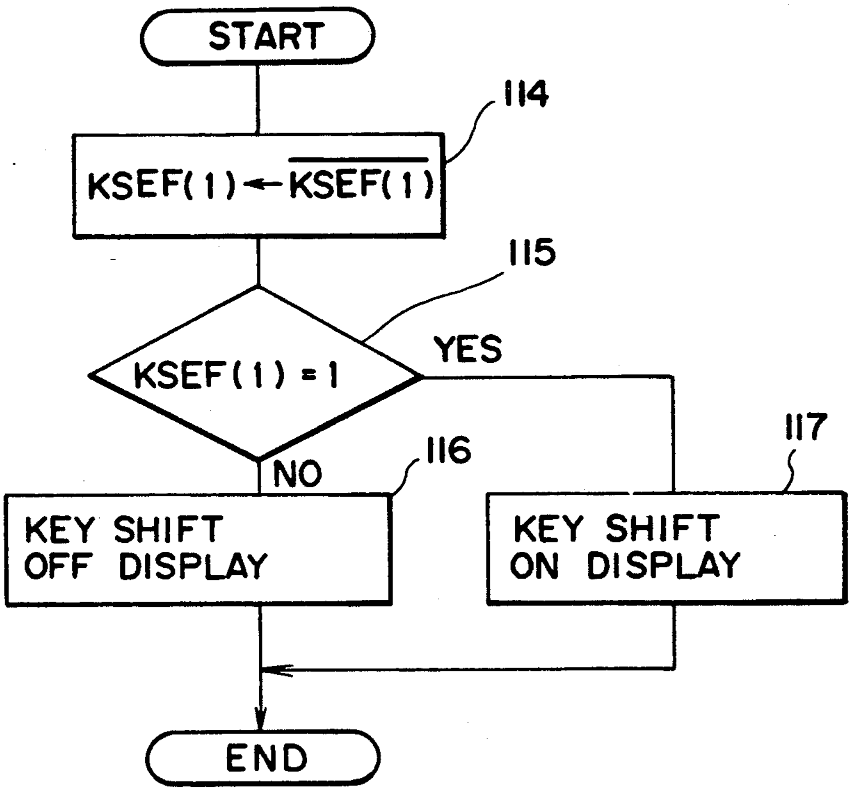
FIG. 27 is a flow chart of a key shift effect.

FIG. 27 shows a routine executed when an ON event of a key shift effect switch is detected in step 109 in the main routine. In step 114, a flag indicating whether or not the key shift effect is applied to predetermined parameters is switched. In step 115, it is checked if the flag is "1", i.e., if the key shift effect is set. If YES in step 115, a key shift ON display is made (step 117); otherwise, a key shift OFF display is made (step 116). In this embodiment, whether or not parameters by the key shift effect of the keyboard are added can be selected in units of parameters.

Figure 28:
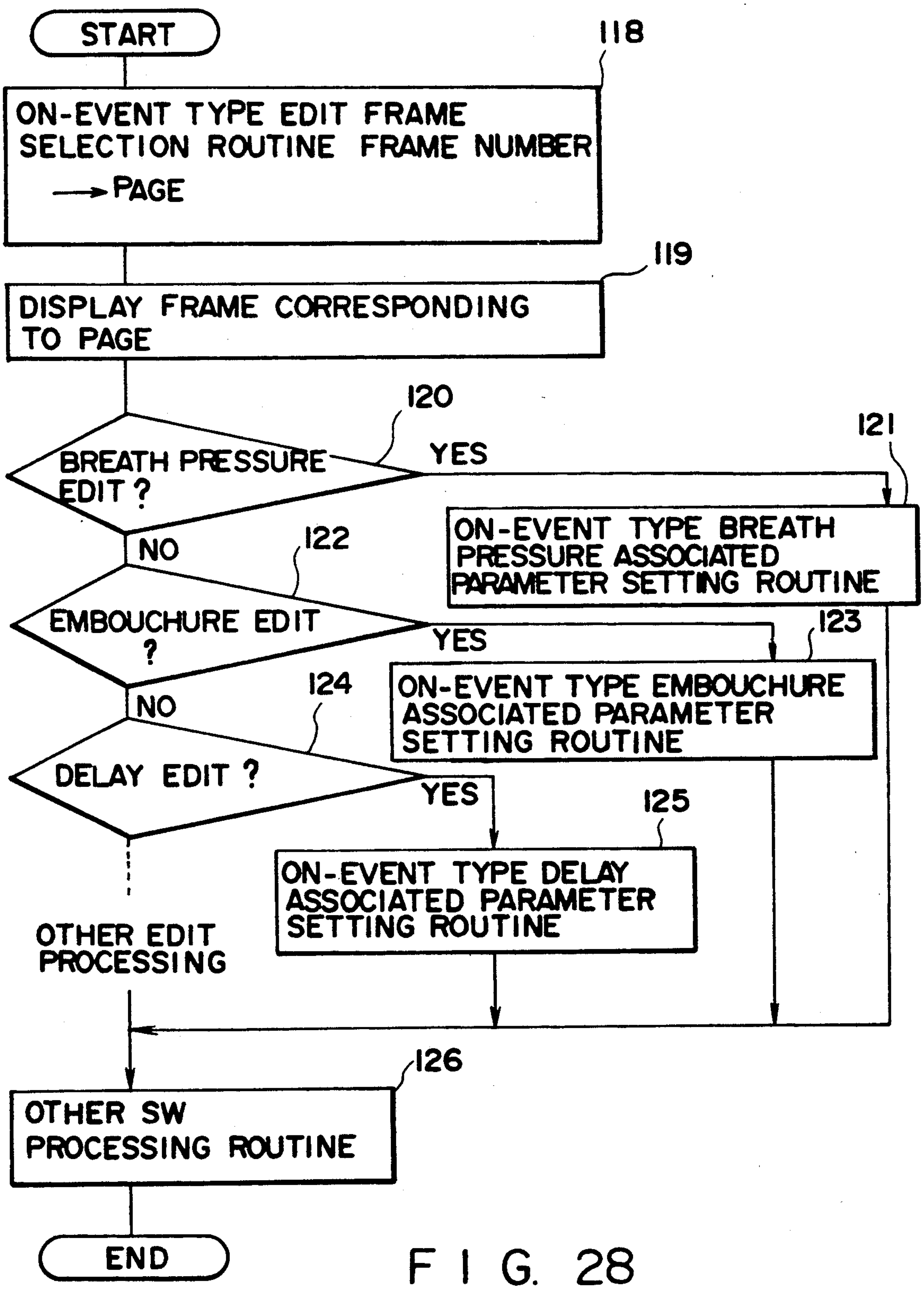
FIG. 28 is a flow chart of panel switch processing.

FIG. 28 shows a routine of the panel switch processing in step 109 in the main routine. An edit frame for displaying parameters to be processed in response to a switch ON event is selected, and its frame number is stored in a register PAGE (step 118). The frame of the stored number is displayed (step 119). Whether or not breath pressure, embouchure, delay, and other edit processing operations are performed is checked in turn (steps 120, 122, and 124). If YES in these steps, routines for respectively setting breath pressure associated parameters, embouchure associated parameters, and delay associated parameters are executed (steps 121, 123, and 125). In addition, other switch processing is executed (step 126).

Figure 29:
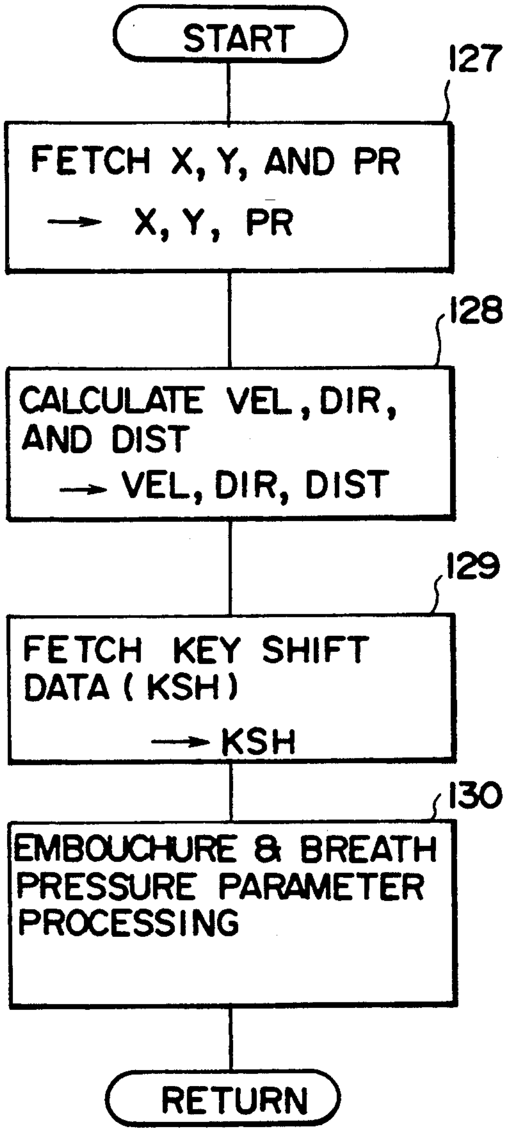
FIG. 29 is a flow chart of a first example of an interrupt routine.

FIG. 29 shows a first interrupt routine by the above-mentioned timer. The X-Y coordinate data X, Y and pressure data PR from the performance operation member are fetched and stored in corresponding registers (step 127). A moving velocity VEL, direction DIR, and distance DIST of the performance operation member are calculated based on these stored data in accordance with a routine (to be described later), and are stored in corresponding registers (step 128). In addition, key shift data is fetched (step 129). Embouchure and breath pressure parameters are calculated based on the above-mentioned data according to a routine (to be described later) (step 130).

Figure 30:
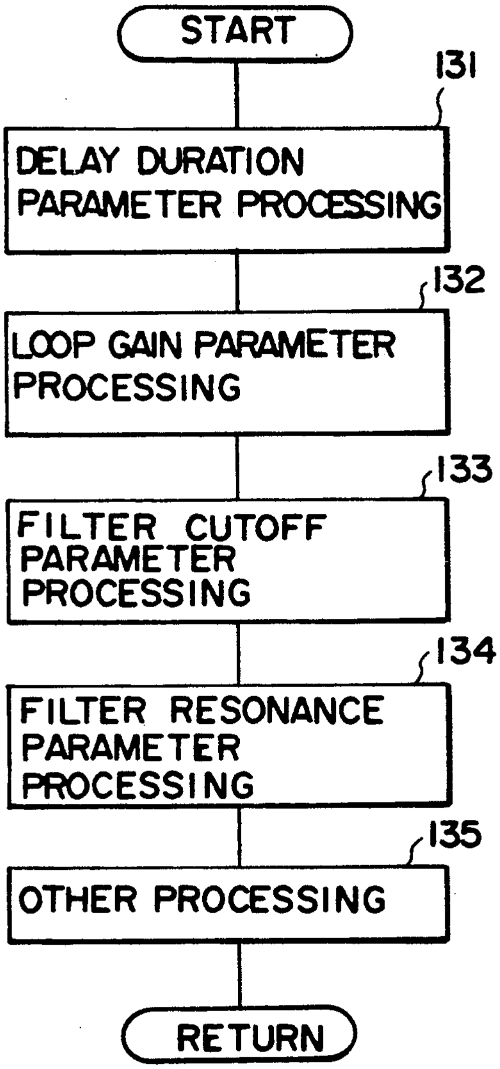
FIG. 30 is a flow chart of a second example of an interrupt routine.

FIG. 30 shows a second interrupt routine by the above-mentioned timer. Delay duration parameter processing is executed according to a routine (to be described later) (step 131). Subsequently, a loop gain of a sound source circuit (to be described later) is calculated (step 132), and filter cutoff parameter processing, filter resonance parameter processing, and other parameter processing are executed in turn (steps 133, 134, and 135).

Figure 31:
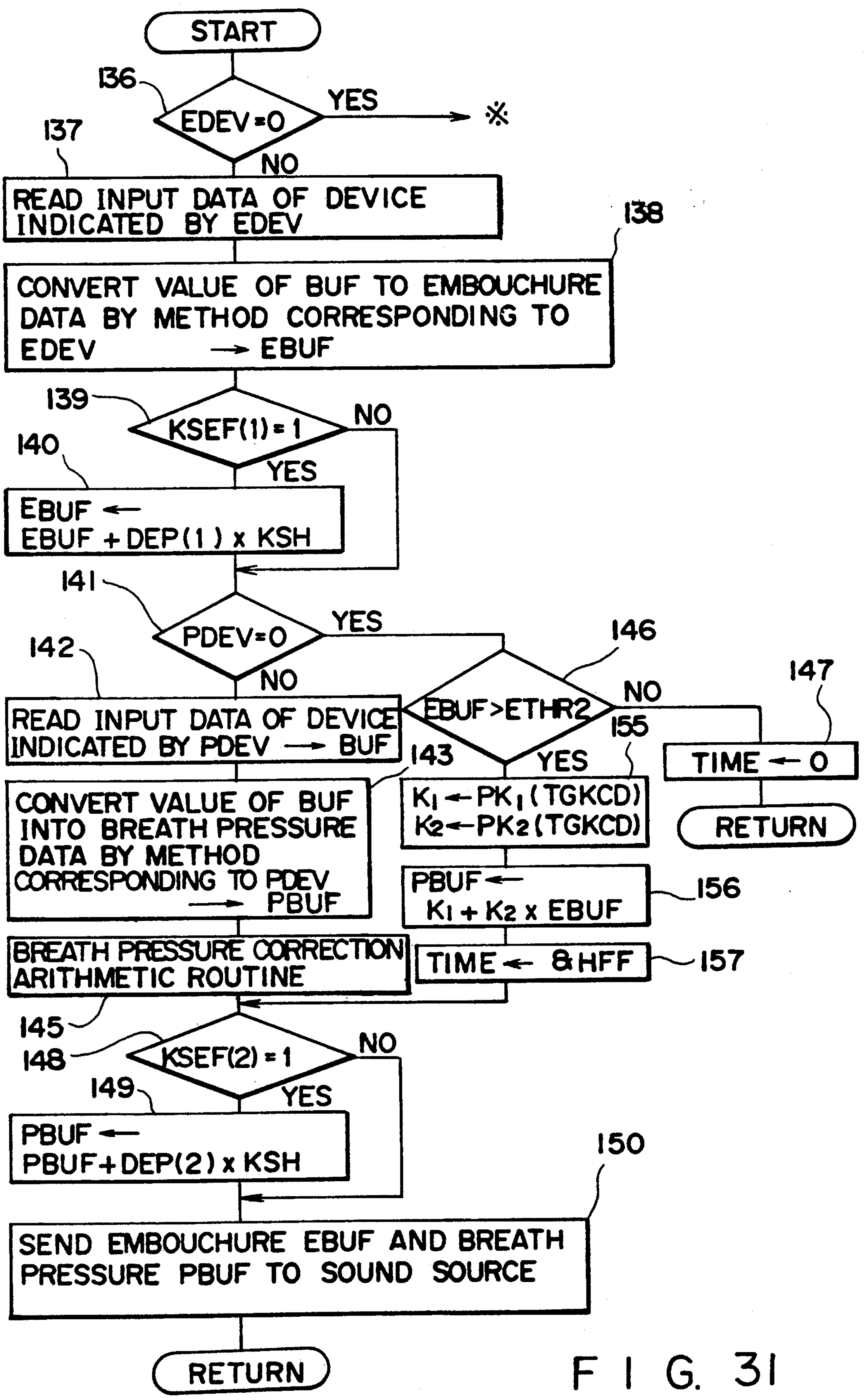
FIGS. 31 and 32 are flow charts of embouchure and breath pressure parameter processing routines.

FIG. 31 shows an embouchure and breath pressure parameter processing routines in the interrupt routine shown in FIG. 29. In step 136, an embouchure device to be processed is determined basec' on a number in the register EDEV. For example, "0" as a device number DEVN represents a standard value or a value obtained by calculations based on other parameters, "1" represents an X-coordinate X of the tablet, "2" represents a Y-coordinate Y, "3" represents a pressure PR of the tablet, "4" represents a velocity VEL of the tablet, and "5" represents a distance DIST. When the content of the embouchure register EDEV is not "0", input data of a device represented by the content of the register EDEV is read out, and is inputted to the register BUF (step 137). The value of the register BUF is converted into embouchure data by a method corresponding to the register EDEV, and is inputted to and stored in a register EBUF (step 138). Subsequently, processing associated with the key shift effect is executed in steps 139 and 140. Note that KSEF(EN) designates a flag indicating whether or not a key shift KSH effect is effective for an (EN)th parameter, and DEP(EN) designates a depth of the key shift effect for the (EN)th parameter when the effect is effective. As the (EN)th parameter number, "1" indicates embouchure; "2", breath pressure; "3", delay duration; 4, loop gain; "5", filter cutoff; and "6", filter resonance. In step 141, a number of a breath pressure register PDEV is discriminated. If the number is "0", it is checked in step 146 if the value of the register EBUF (steps 138 and 140) is larger than a predetermined threshold value. If the value of the register is smaller than the threshold value, input data is ignored as noise, and a processing time is cleared to 0 (step 147). If the value of the register is larger than the threshold value. predetermined operators $K_1$ and $K_2$ are calculated (step 155). Predetermined calculations are performed based on these operators, and the calculation result is inputted to a register PBUF (step 156). Subsequently, a register TIME is rewritten (step 157). If it is determined in step 141 that the number is other than "0", input data of a device represented by the content of the register PDEV is read out, and is inputted to and stored in the register BUF (step 142). The value of the register BUF is converted into breath pressure data by a method corresponding to the register PDEV, and the converted data is inputted to and stored in the register PBUF (step 143). A breath pressure correction arithmetic routine (to be described later) is then executed (step 145). The same processing associated with the key shift effect as in steps 139 and 140 described above is executed (steps 148 and 149). The embouchure data EBUF and breath pressure data PBUF obtained as described above are sent to the sound source (step 150).

Figure 32:
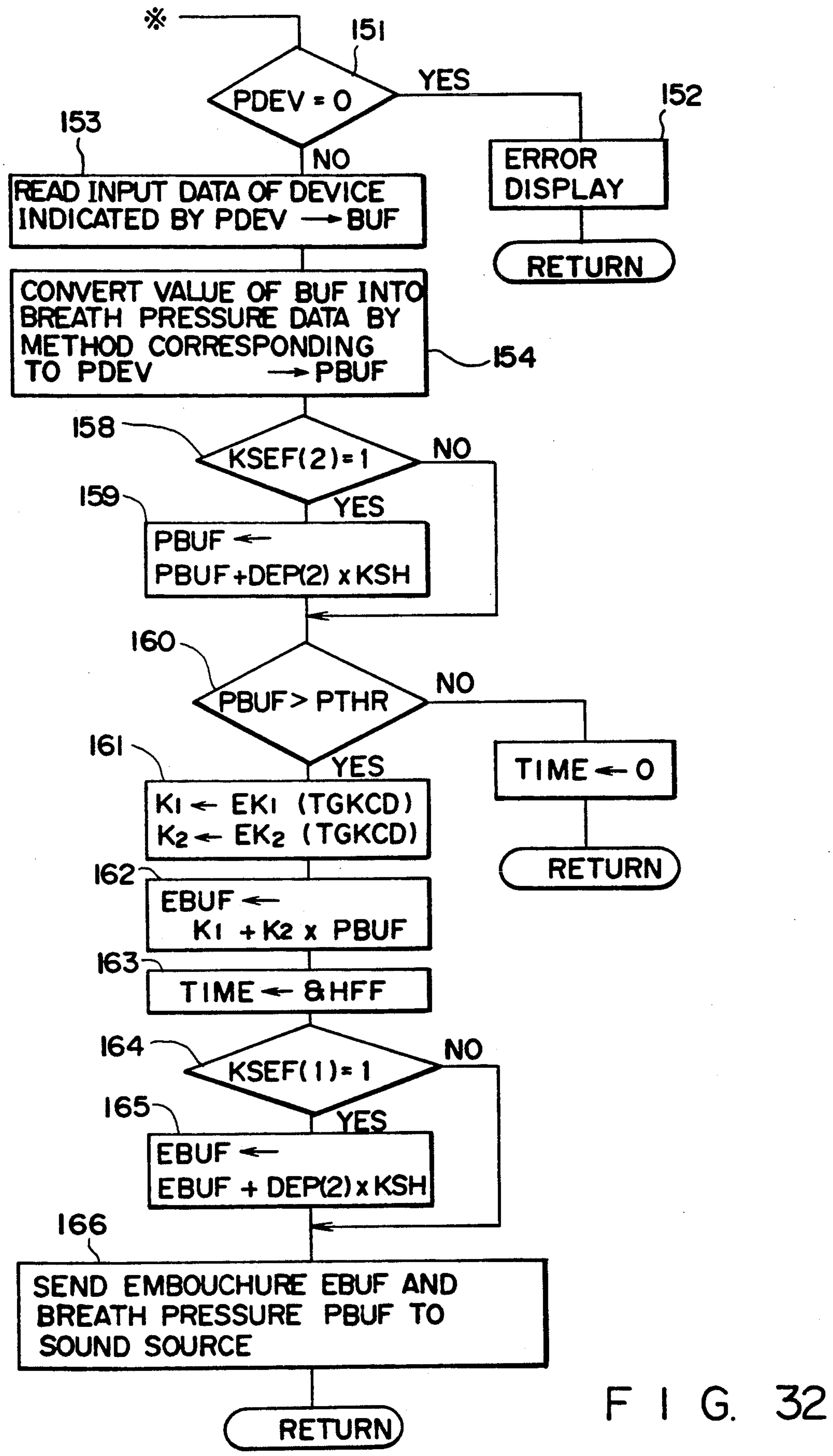

If it is determined in step 136 that the content of the embouchure device register EDEV is "0", a routine shown in FIG. 32 is started. A device is discriminated on the basis of a number stored in the breath pressure device register PDEV (step 151). If the content of the register PDEV is also "0", an error is displayed (step 152). If the content of the register PDEV is other than "0", input data of a device represented by the register PDEV is read out, and is inputted to and stored in the register BUF (step 153). The value of the register BUF is converted into breath pressure data by a method corresponding to the register PDEV, and the converted data is inputted to and stored in the register PBUF (step 154). The content of the register PBUF is compared with a predetermined threshold value (step 160). If the content is smaller than the threshold value, input data is ignored as noise. If the content is larger than the threshold value, predetermined operators $K_1$ and $K_2$ are calculated (step 161). Predetermined calculations are performed on the basis of these operators, and the calculation result is inputted to the register EBUF (step 162). Thereafter, the register TIME is rewritten (step 163). The same processing associated with the key shift effect as in steps 139 and 140 described above is executed (steps 164 and 165). The embouchure data EBUF and breath pressure data PBUF obtained as described above are sent to the sound source (step 166).

Figure 33:
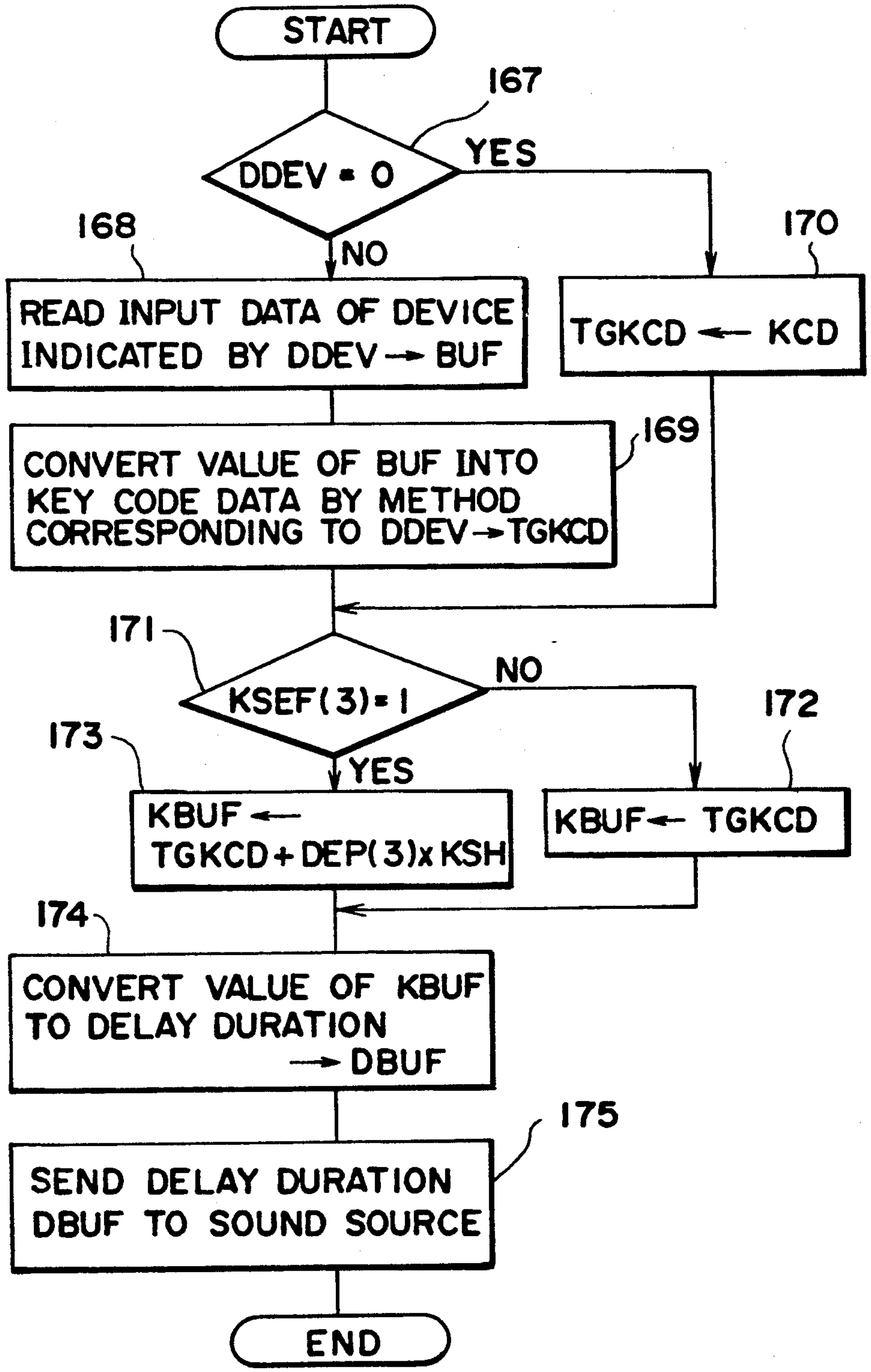
FIG. 33 is a flow chart of a delay duration parameter processing routine.

FIG. 33 shows a delay duration parameter processing routine in step 131 in the interrupt routine shown in FIG. 30. A device is discriminated based on a number stored in a delay duration register DDEV (step 167). If the content of the register DDEV is "0", a key code is inputted to a delay duration key code register TGKCD (step 170). If the content of the register DDEV is other than "0", input data of a device represented by the register DDEV is read out, and is inputted to and stored in the register BUF (step 168). The value of the register BUF is converted into key code data by a method corresponding to the register DDEV, and the converted data is inputted to the register TGKCD (step 169). It is then checked if the key shift effect is applied to a delay duration (step 171). If NO in step 171, data in the register TGKCD is directly inputted to a register KBUF (step 172). However, if YES in step 171, correction calculations are performed, and the corrected data is inputted to the register KBUF (step 173). The value of the register KBUF is converted into a delay duration, and the converted data is inputted to a delay duration register DBUF (step 174). The delay duration data obtained as described above is sent to the sound source (step 175).

Figure 34:
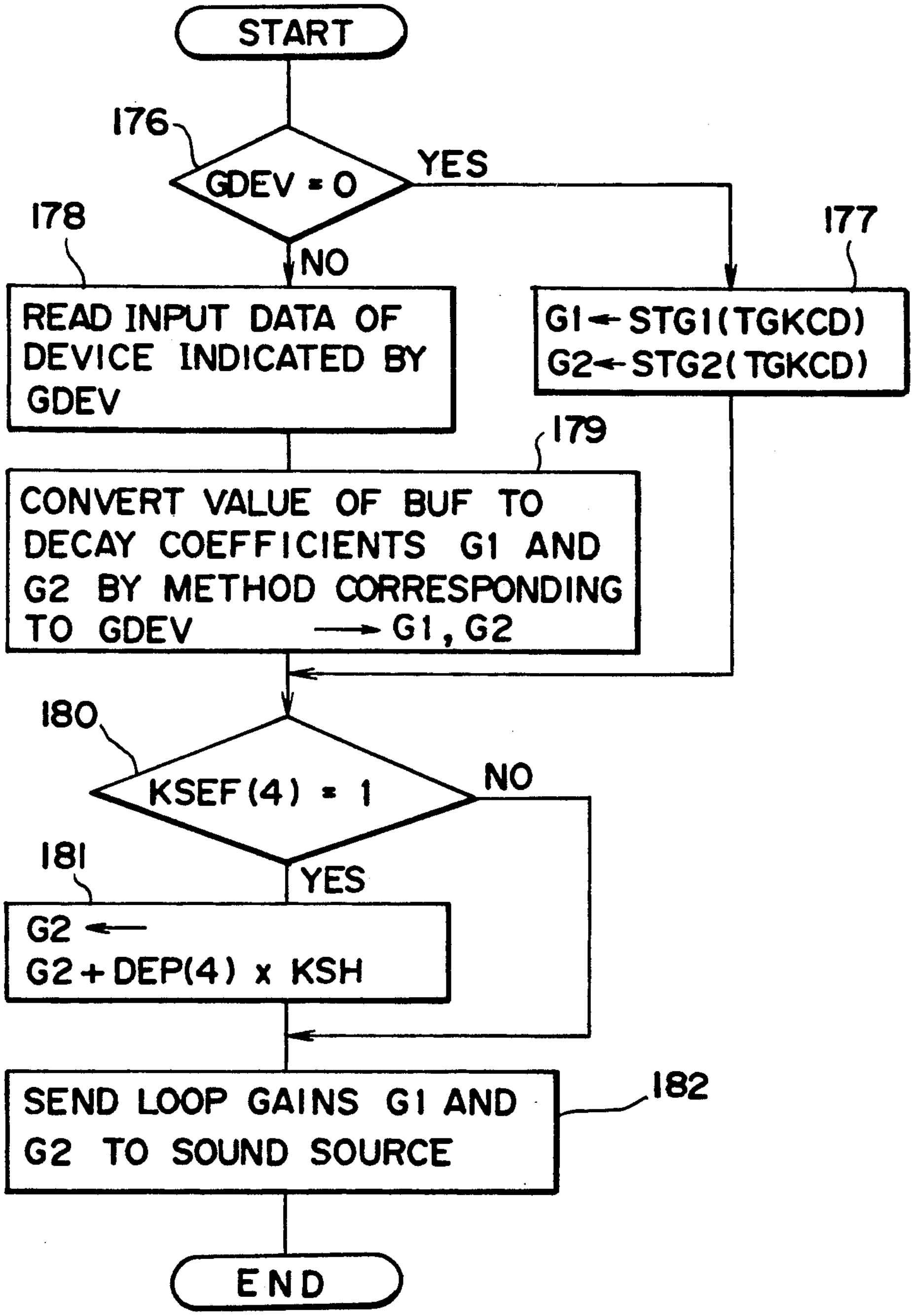
FIG. 34 is a flow chart of a loop gain processing routine.

FIG. 34 shows a loop gain parameter processing routine in the interrupt routine (FIG. 30). In step 176, a number in a gain device register GDEV is discriminated. If the number is "0", loop gains G1 and G2 for inputting standard gains STG1 and STG2 to the sound source circuit are set (step 177). If the number is other than "0", input data of a device indicated by the register GDEV is read out, and is inputted to and stored in the register BUF (step 178). The value of the register BUF is converted into decay coefficients by a method corresponding to the register GDEV, and are set as gains G1 and G2. Key shift processing is performed for the loop gains (steps 180 and 181), and the finally obtained loop gains G1 and G2 are sent to the sound source (step 182).

Figure 35:
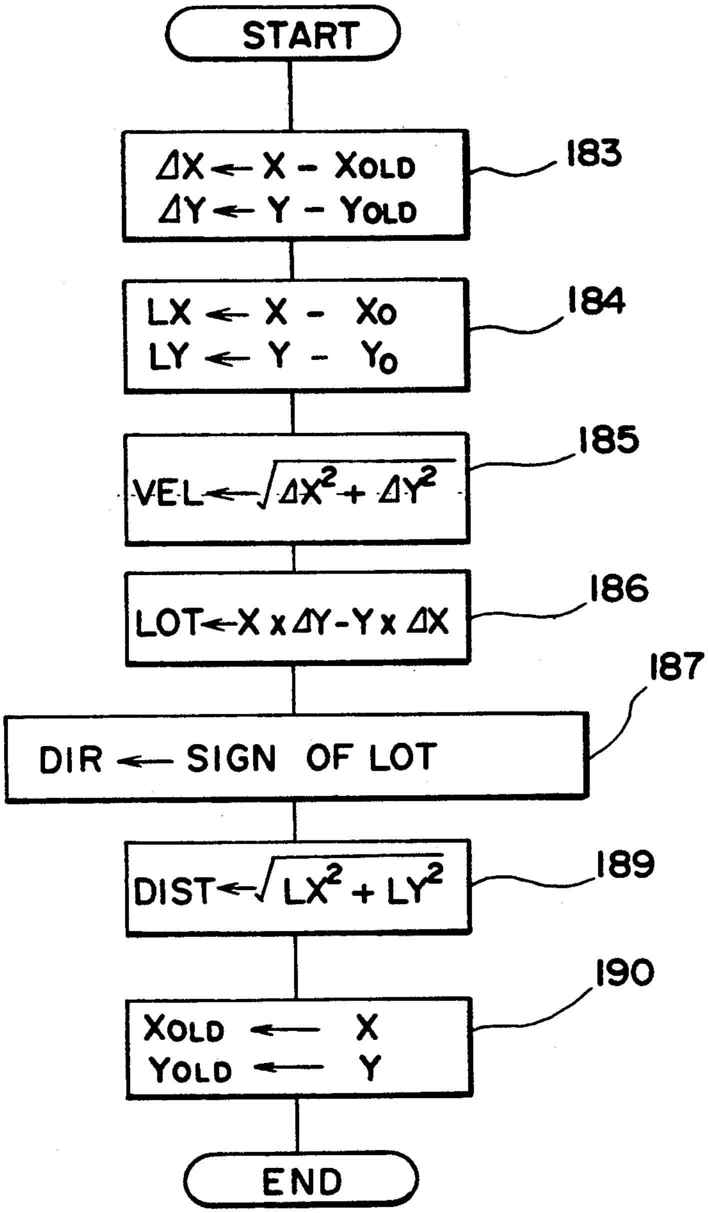
FIG. 35 is a flow chart of an arithmetic processing routine.

FIG. 35 shows an arithmetic routine in step 128 in the interrupt routine (FIG. 29) at a predetermined cycle by the timer. In step 183, moving amounts $\Delta X$ and $\Delta Y$ in respective directions are obtained based on differences between previous and present X- and Y-coordinate positions (XOLD and X, YOLD and Y). In step 184, distances $L_x$ and $L_Y$ from a reference position ($X_0$, $Y_0$) are obtained. A velocity VEL, rotation amount LOT, a rotational direction DIR, a moving distance DIST are obtained by predetermined calculations shown in FIG. 35 based on the above-mentioned data (steps 185, 186, 187, and 189). After these calculations, the present position data X and Y are stored in registers for the next calculations (step 190).

Figure 36:
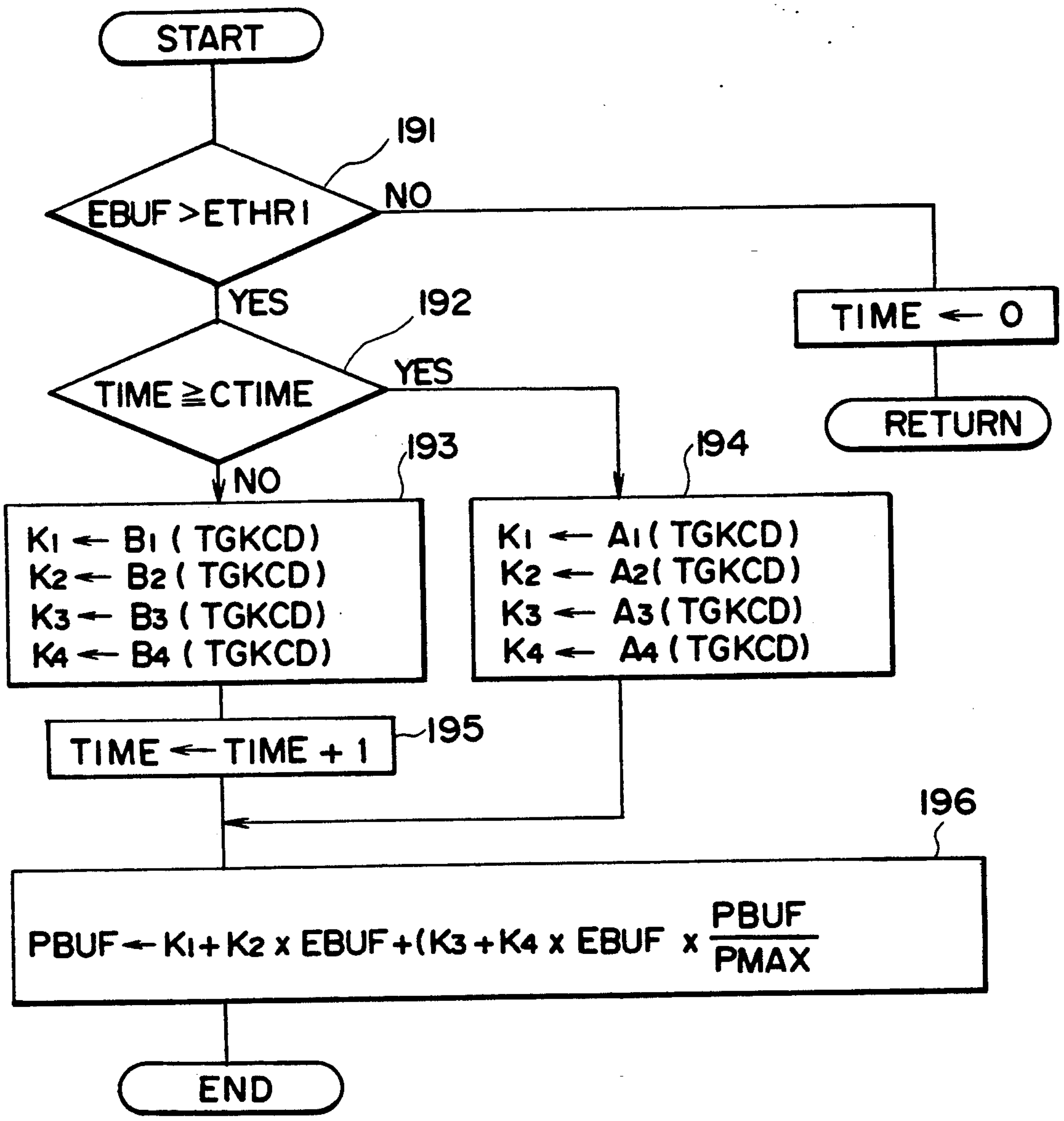
FIG. 36 is a flow chart of a first example of a breath pressure correction routine.
Figure 39:
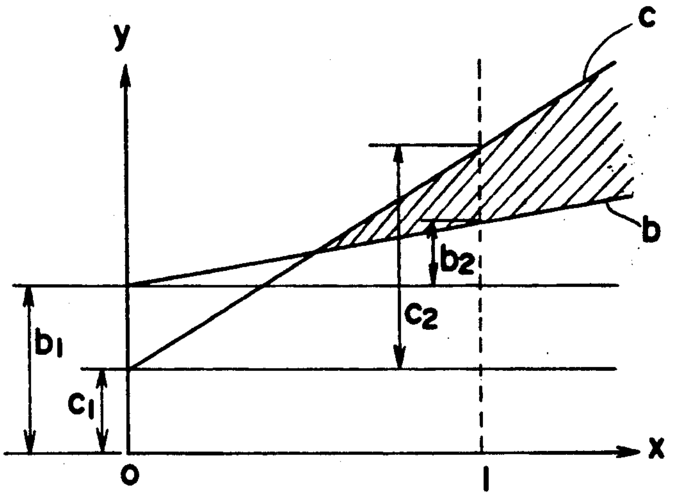
FIG. 39 is a graph for explaining a breath pressure correction calculation.

FIG. 36 shows a first example of a breath pressure correction arithmetic routine in step 145 in FIG. 31. The data EBUF calculated in the embouchure and breath pressure parameter processing routine (FIGS. 31 and 32) is compared with a predetermined threshold value (step 191). If the data is smaller than the threshold value, it is ignored as noise. If the data is larger than the threshold value, it is checked if a processing count reaches a predetermined value (step 192). If NO in step 192, predetermined operators $B_1$, $B_2$, $B_3$, and $B_4$ are obtained based on the content of the delay duration key code register TGKCD, and are set as $K_1$, $K_2$, $K_3$, and $K_4$ (step 193). These operators $B_1$, $B_2$, $B_3$, and $B_4$ respectively correspond to $b_1$, $b_2$, $c_1-b_1$, and $c_2-b_2$ in a graph of straight lines b and c for dividing a tone generation region, as shown in FIG. 39. In this graph, the straight lines b and c are expressed by $y=b_1+b_2x$, and $y=c_1+c_2x$, respectively. Assuming that an input in the x-direction is represented by $x_{in}$ and an input in the y-direction is represented by $y_{in}$, if, for example, y is caused to fall within a tone generation region between the straight lines b and c by arithmetic correction, calculations are made for $x=x_{in}$, and $y=b_1+b_2x+\{(c_1-b_1)+(c_2-b_2)x\}y_{in}/y_{inMAX}$.

After $K_1$, $K_2$, $K_3$, and $K_4$ are obtained in step 193, the processing count is incremented (step 195). A predetermined calculation is performed based on these $K_1$, $K_2$, $K_3$, and $K_4$, and the calculation result is stored in the register PBUF (step 196). The calculation in step 196 corresponds to the one executed for $x=x_{in}$ and $y=b_1+b_2x+\{(c_1-b_1)+(c_2-b_2)x\}y_{in}/y_{inMAX}$.

If it is determined in step 192 that the processing count reaches the predetermined setting value, $A_1$, $A_2$, $A_3$, and $A_4$ are obtained based on the content of the register TGKCD, and are set as $K_1$, $K_2$, $K_3$, and $K_4$ (step 194), thus performing the calculation in step 196. These operators $A_1$, $A_2$, $A_3$, and $A_4$ respectively correspond to $b_1$, $b_2$, $c_1-b_1$, and $c_2-b_2$ in a graph of straight lines b and c for dividing a tone generation region shown in FIG. 39 in the same manner as the operators $B_1$, $B_2$, $B_3$, and $B_4$.

Figure 37:
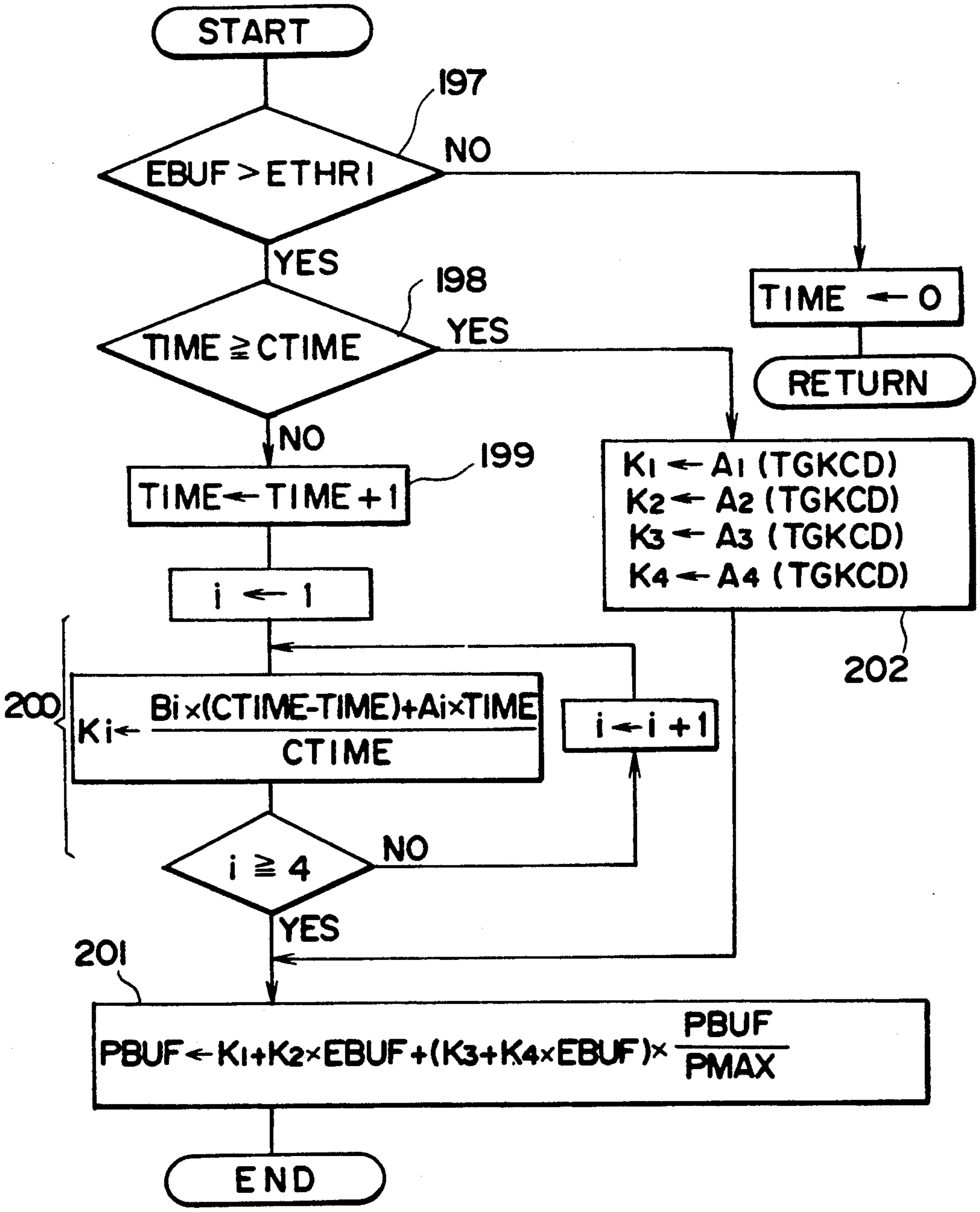
FIG. 37 is a flow chart of a second example of a breath pressure correction routine.

FIG. 37 shows a second example of a breath pressure correction arithmetic routine. Like in the first example (FIG. 36), the content of the register EBUF is compared with a predetermined threshold value (step 197), and a processing count is compared with a predetermined setting value (step 198). If the processing count is equal to our smaller than the setting value, the register TIME is incremented (step 199). In step 200, i is set, and a calculation shown in FIG. 37 is repeated four times, thereby calculating $K_1$, $K_2$, $K_3$, and $K_4$. On the other hand, if it is determined in step 198 that the processing count reaches the setting value, $K_1$, $K_2$, $K_3$, and $K_4$ are obtained based on the content of the register TGKCD like in step 194 in FIG. 36 (step 202). Data PBUF is calculated based on the $K_1$, $K_2$, $K_3$, and $K_4$ obtained in this manner like in step 196 in FIG. 36 (step 201).

Figure 38:
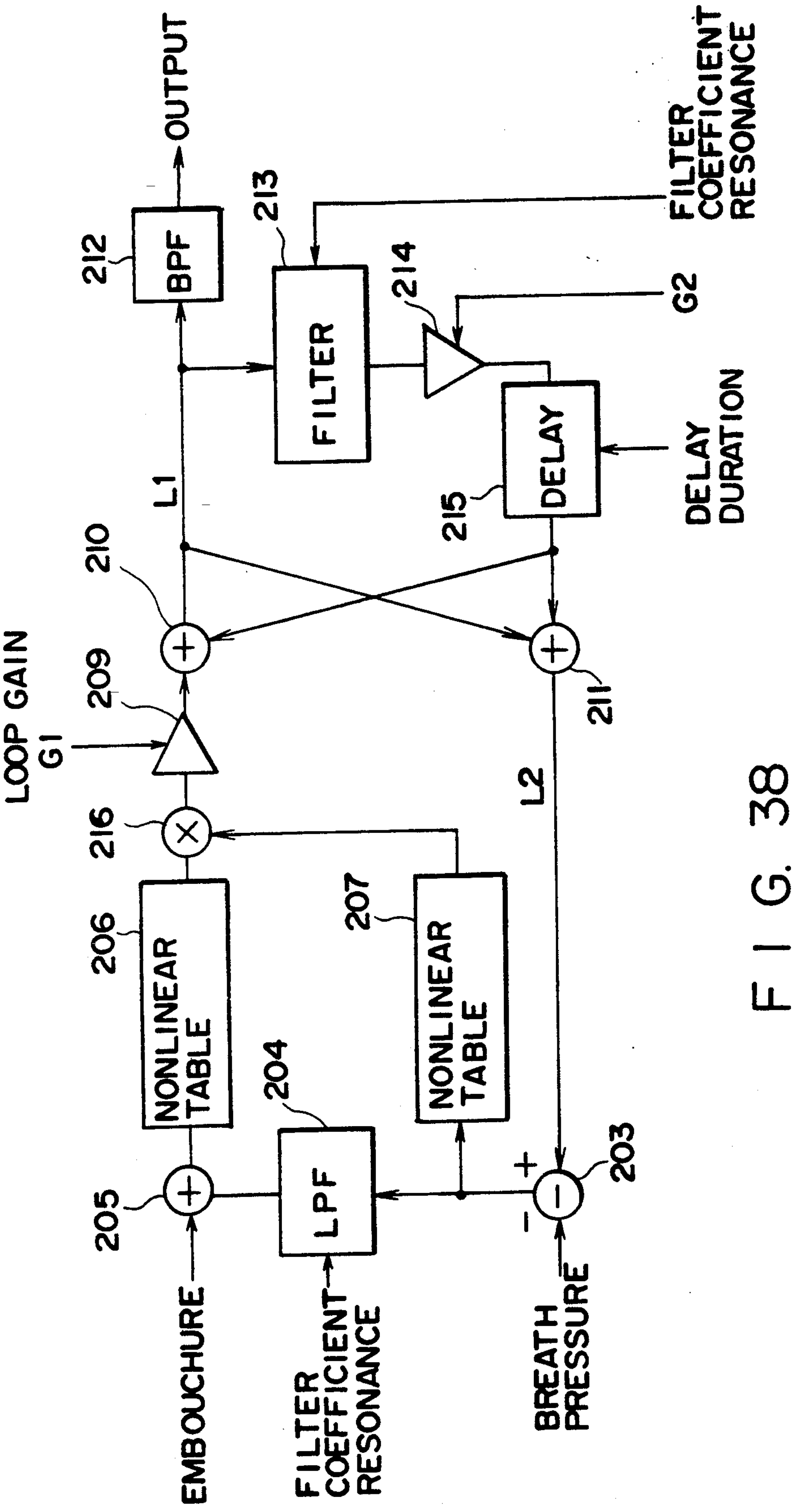
FIG. 38 is a circuit diagram showing a sound source circuit of a wind instrument algorithm.

FIG. 38 shows an arrangement of a sound source circuit of a wind instrument algorithm according to the present invention. The sound source is corresponding to the sound source 97 in FIG. 23. The breath pressure signal PBUF and the embouchure signal EBUF which are corrected as described above are respectively inputted to a subtractor 203 and an adder 205 serving as circuit input sections. The subtractor 203 subtracts the breath pressure signal from an input signal at a signal line L2, thereby outputting a differential pressure signal for displacing a reed of a mouthpiece. A low-pass filter 204 is connected to the output side of the subtractor 203, and removes a high-frequency component of the differential pressure signal. This is to cause the reed not to respond to the high-frequency component. The adder 205 adds the embouchure signal to the output signal from the low-pass filter 204, and outputs the sum signal to a nonlinear table 206. The nonlinear table 206 simulates a displacement amount of the reed with respect to a given pressure, and has predetermined input/output characteristics. The output from the nonlinear table 206 serves as a signal representing an air path area of the reed of the mouthpiece. The output from the nonlinear table 206 is connected to one input of a multiplier 216. The other input of the multiplier 216 receives the differential pressure signal from the subtractor 203 via a nonlinear table 207. The nonlinear table 207 simulates the fact that even if a difference pressure is increased, a flow rate is saturated in a narrow tube path, and the differential pressure is not proportional to the flow rate. The output signal from the multiplier 216 serves as a signal representing an air flow rate in the reed of the mouthpiece on the basis of these two input signals.

The multiplier 216 is connected to an adder 210 via an attenuator 209. The attenuator 209 receives the loop gain G1 obtained by the above-mentioned arithmetic routine (FIG. 34). The attenuator 209 is connected to the input side of an adder 210.

The adder 210 constitutes a junction together with an adder 211. The adder 210 adds an output signal of a delay circuit 215 for constituting the signal line L2, and an output signal from the attenuator 209, and outputs the sum signal onto a signal line L1. The other adder 211 adds a signal on the signal line L1 and a signal from the delay circuit 215, and outputs the sum signal onto the signal line L2. This loop can simulate a synthesized pressure of an incident wave by an input flow rate immediately after a gap between the mouthpiece and the reed, and a wave reflected by a resonance pipe.

The signal on the signal line L2 is fed back to the signal line L2 via a filter 213, an attenuator 214, and the delay circuit 215. The filter 213 comprises a low-pass filter alone or a combination of a low-pass filter and a high-pass filter. The filters 204 and 213 receive the filter cutoff parameter and the resonance parameter which are calculated in the above-mentioned interrupt routine (FIG. 30). The attenuator 214 receives the loop gain G2 obtained in the arithmetic routine shown in FIG. 34. The delay circuit 215 receives the delay duration parameter obtained in the arithmetic routine shown in FIG. 33. The filter 213 simulates the shape of the resonance pipe. The delay circuit 215 simulates a state wherein an incident wave from the mouthpiece is returned to the mouthpiece as a reflection wave in correspondence with the length of the resonance pipe, and the length between an end portion of the resonance pipe to a tone hole.

A waveform signal on the signal line L2 is extracted as an electronic tone output via a band-pass filter 212 for simulating radiation characteristics of a musical tone in air.

Figure 40:
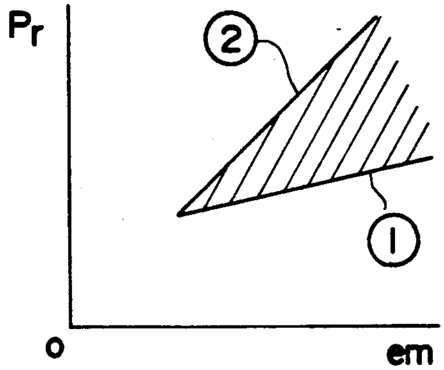
FIG. 40 is a graph showing the relationship between a breath pressure and an embouchure in the wind instrument algorithm.

FIG. 40 is a graph showing the relationship between a breath pressure pr and an embouchure em. A hatched portion between straight lines 1 and 2 represents a range where a tone can regularly sound. The pen on the three-dimensional table outputs a writing pressure in addition to the X- and Y-coordinates. Therefore, for example, the embouchure is calculated by (Y-coordinate) x (writing pressure/maximum value of writing pressure), and the breath pressure can be calculated based on the embouchure.

Equations of the straight lines 1 and 2 are assumed as follows:

Straight Line 1: $pr=em/a+a'$

Straight Line 2: $pr=em/d+d'$

In this case, the breath pressure of the hatched portion can be given by $pr=em/d+d'+\{(1/a-1/d)em+a'-d'\}\times$(X-coordinate)/(maximum value of X-coordinate).

In the wind instrument algorithm, assignment examples of input pressure and X- and Y-coordinate parameters by the three-dimensional tablet (or a mouse, or a joystick), and musical tone control parameters are summarized as follows:

(a) A pressure is assigned to the embouchure, and an X-coordinate is assigned to the breath pressure.

(b) A velocity (calculated from the X- and Y-coordinates) is assigned to the embouchure, and a pressure is assigned to the breath pressure.

(c) A Y-coordinate is assigned to the embouchure, and a pressure is assigned to the breath pressure.

Figure 41A:
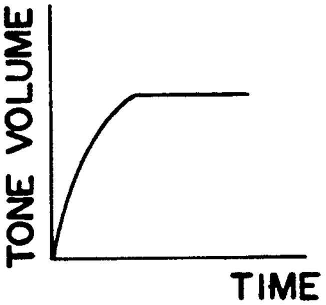
FIGS. 41A and 41B are graphs showing the relationship between a time and a tone volume when a tone rises in correspondence with high and low pressures.
Figure 41B:
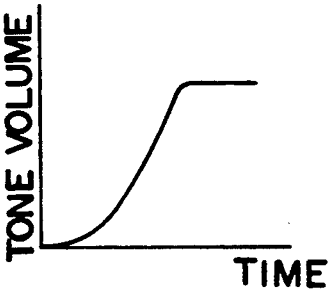

(d) A pressure is assigned to degrees of rising and muting, the embouchure is obtained based on a velocity, and the breath pressure is obtained based on the embouchure. A tone is set to rise when the pressure is changed from 0. FIGS. 41A and 41B show the relationship between a rising time of a tone and a tone volume. FIG. 41A shows a case wherein a change in pressure is large, and FIG. 41B shows a case wherein a change in pressure is small. This assignment is executed when a velocity is 0, e.g., when an operation is started.

Figure 42A:
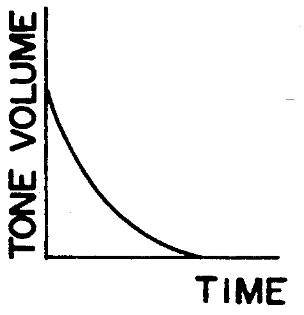
FIGS. 42A and 42B are graphs showing a relationship between a time and a tone volume when a tone decays in correspondence with high and low pressures.
Figure 42B:
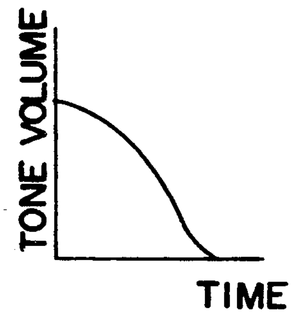

A tone is set to be muted when the pressure is changed to 0. FIGS. 42A and 42B show the relationship between a tone volume and a time in this case. FIG. 42A shows a case wherein a change in pressure is large, and FIG. 42B shows a case wherein a change in pressure is small. This assignment is executed when a velocity becomes 0, e.g., when an operation is ended.

(e) A pressure is assigned to degrees of rising and muting, a distance from the central coordinates of the operation member is assigned to the embouchure, and a velocity is assigned to the breath pressure.

(f) A pressure is assigned to degrees of rising and muting, the embouchure is obtained based on a distance from the central coordinates of the operation member, and the breath pressure is calculated based on the embouchure.

Figure 43:
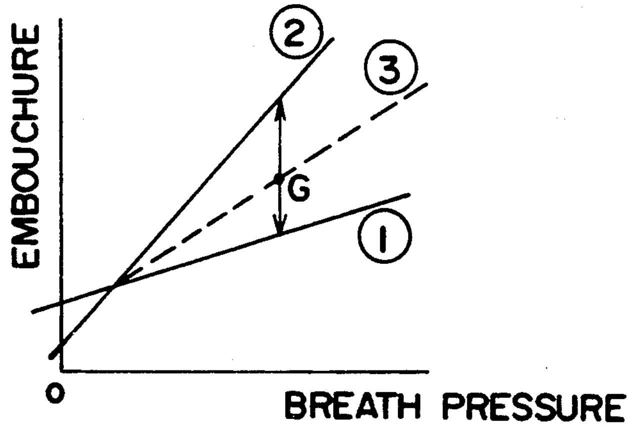
FIG. 43 is a graph for explaining a key shift effect in the wind instrument algorithm.

FIG. 43 is a graph for explaining a parameter control method in consideration of key shift data. When key shift data is inputted, a tone is vibrated. In a normal state, the breath pressure is given by breath pressure=pressure$\times$velocity, and is controlled to be shifted along a dotted straight line 3 in FIG. 43. In this case, the embouchure is given by embouchure=constant$\times$breath pressure, and is calculated based on the breath pressure. When key shift data is inputted, the breath pressure is fixed at that time, and the embouchure is changed from a point G on the straight line 3 within a range of straight lines 1 and 2 in accordance with the key shift data. Thus, a vibrato effect can be easily obtained.

In this embodiment, tone generation region characteristics of a bowed instrument or a wind instrument are approximated by four straight lines. However, an arbitrary number of straight lines may be adopted or curves may be adopted depending on a physical sound source algorithm to be used.

The input operation member may comprise one other than the above-mentioned slide volume type operation member (FIGS. 8 and 9) or the three-dimensional tablet (FIG. 18).

Figure 44:
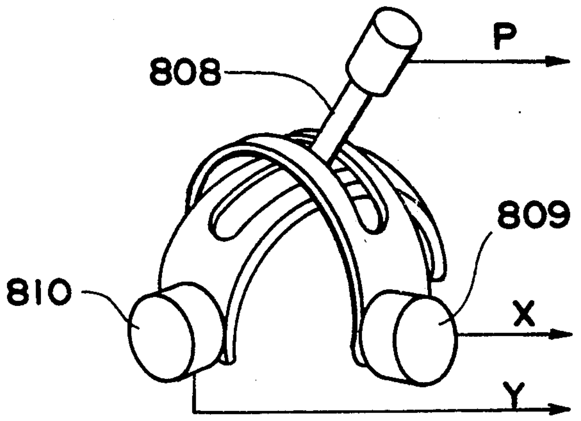
FIG. 44 is a perspective view for explaining another performance operation member.

FIG. 44 shows another arrangement of the performance operation member. In this arrangement, a joystick mechanism is used. When an operation rod 808 supported by a rotary bearing (not shown) is rotated to an arbitrary position, rotary volumes 809 and 810 in X and Y directions are rotated, and X- and Y-rotational positions can be detected. When a pressure sensor is arranged on a grip portion of the operation rod 808, an operation pressure can be detected.

Figure 45:
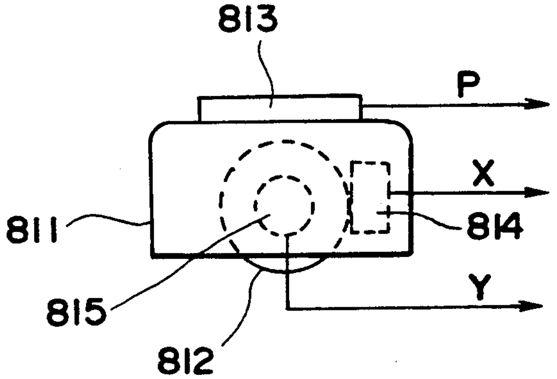
FIG. 45 is a view for explaining still another performance operation member.

FIG. 45 shows still another arrangement of the performance operation member. This arrangement employs a mouse mechanism. A rotatable ball 812 is mounted in a main body 811, and is rolled on a flat plate. Thus, X- and Y-moving amounts are detected by rotary volumes 814 and 815, and are outputted as X- and Y-position data. When a pressure sensor 813 is arranged on the upper surface of the main body, a pressing force can be outputted as pressure data.

EFFECT OF THE INVENTION

As described above, according to the present invention, when musical tone parameters are controlled on the basis of operation data of a performance operation member, the musical tone parameters are corrected based on tone generation region characteristic graphs based on the musical tone parameters, so that an electronic tone generated by the musical tone parameters can fall within a regular tone generation region, and thereafter, the corrected parameters are inputted to a sound source. Therefore, a tone can be reliably generated regardless of an operation state of the performance operation member, and an electronic musical instrument can be easily played.

Since rising processing and sustaining processing of a tone are switched and controlled based on the tone generation characteristic graphs, a tone can be reliably generated, and an expression width of a tone can be widened.

In particular, when the tone generation region characteristic graphs of a wind instrument algorithm are used, tone colors of a wind instrument can be expressed by an electronic musical instrument. In this case, a player can enjoy more expressions than an acoustic wind instrument. This electronic musical instrument can be played easier than an acoustic wind instrument, and tones can be reliably generated upon operation of an operation member. Therefore, a player can easily breath. In a wind instrument, tones are controlled based on the embouchure of a reed, a breath pressure, and the like during a performance. However, since the operation member can be operated by moving a hand, tones can be controlled easily. Since a player can desirably move his or her hand on the operation member, a dynamic range can be widened. A tone volume and tone quality can be easily controlled. In addition, a tone generation operation and tones can coincide with each other in terms of feeling. Furthermore, a sustaining time of a tone can be prolonged.

What is claimed is:

1. A method of controlling a sound source for an electronic musical instrument which comprises the steps of:
   - outputting operation data of a performance operation member corresponding to musical tone control parameters of a musical instrument;
   - correcting said operation data into values falling within a particular one of plural tone generation regions determined in accordance with at least one musical tone control parameter of said musical instrument; and
   - inputting said corrected operation data to said sound source.

2. A method according to claim 1, wherein said tone generation regions are determined based on a relation between two of said musical tone control parameters, and represents tone generation of said sound source designated as either regular or irregular, wherein the operation data is corrected to fall within a regular region.

3. A method according to claim 1, wherein said tone generation regions are expressed by a graph defined by four curves in a coordinate system in which two of said musical tone control parameters are respectively plotted along the ordinate and the abscissa, and a region defined by central two of said four curves constitutes a tone generation region, regions outside the tone generation region constitute generated tone sustaining regions and regions outside outermost two of said four curves constitute irregular tone regions.

4. A method according to claim 3, wherein said two musical tone control parameters are a bow pressure and a bow velocity.

5. A method according to claim 3, wherein said two musical tone control parameters are a breath pressure and an embouchure.

6. An electronic musical instrument comprising:
   - performance operation means for outputting operation data corresponding to musical tone control parameters of a musical instrument;
   - correcting means for correcting said operation data output by said performance operation means into values falling within a particular one of plural tone generation regions determined in accordance with at least one musical tone control parameter of said musical instrument; and
   - sound source means for receiving said corrected operation data as said musical tone control parameters and for generating a musical tone based on said corrected operation data, said musical tone simulating said musical instrument.

7. An electronic musical instrument according to claim 6, wherein said musical instrument is a rubbed string instrument, said musical tone control parameters comprises a bow pressure and a bow velocity and said performance operation means is a three-dimensional input device which outputs first position data, second position data and pressure data as said operation data.

8. An electronic musical instrument according to claim 6, wherein said musical instrument is a wind instrument, said musical tone control parameters comprises a breath pressure and an embouchure and said performance operation means is a three-dimensional input device which outputs first position data, second position data and pressure data as said operation data.

9. An instrument according to claim 6, wherein said particular tone generation region is changed so that it differs at the time of tone rising from at the time of its duration.

10. An instrument according to claim 6, wherein said sound source is a physically modelled sound source.

* * * * *